United States Patent
Yamazaki

(10) Patent No.: US 10,170,633 B2
(45) Date of Patent: Jan. 1, 2019

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 5 days.

(21) Appl. No.: 15/601,301

(22) Filed: May 22, 2017

(65) Prior Publication Data
US 2017/0256646 A1 Sep. 7, 2017

Related U.S. Application Data

(63) Continuation of application No. 13/345,791, filed on Jan. 9, 2012, now Pat. No. 9,673,336.

(30) Foreign Application Priority Data

Jan. 12, 2011 (JP) .................... 2011-004329

(51) Int. Cl.
*H01L 29/78* (2006.01)
*H01L 29/786* (2006.01)
*H01L 29/417* (2006.01)

(52) U.S. Cl.
CPC .... *H01L 29/7869* (2013.01); *H01L 29/41733* (2013.01)

(58) Field of Classification Search
CPC ............. H01L 29/41733; H01L 29/7869
See application file for complete search history.

(56) References Cited

U.S. PATENT DOCUMENTS 5,311,041 A 5/1994 Tominaga et al.
5,528,032 A 6/1996 Uchiyama
(Continued)

FOREIGN PATENT DOCUMENTS

CN 101013665 A 8/2007
CN 101246909 A 8/2008
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Joseph Galvin, III
(74) *Attorney, Agent, or Firm* — Robinson Intellectual Property Law Office; Eric J. Robinson

(57) ABSTRACT

A transistor having an oxide semiconductor film in a channel formation region and a manufacturing method thereof are disclosed. The transistor is formed by the steps of: forming a base insulating over a substrate; forming an oxide semiconductor film over the base insulating film; forming a conductive film over the oxide semiconductor film; processing the conductive film to form a source electrode and a drain electrode; processing the oxide semiconductor film; forming a gate insulating film over the source electrode, the drain electrode, and the oxide semiconductor film; and forming a gate electrode over the gate insulating film. The aforementioned manufacturing method allows the formation of a transistor in which a side surface of the oxide semiconductor film is not in direct contact with bottom surfaces of the source electrode and the drain electrode, which contributes to the extremely small leak current of the transistor.

8 Claims, 19 Drawing Sheets

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,429,059 B2 | 8/2002 | Yamazaki et al. |
| 6,493,048 B1 | 12/2002 | Baek et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,524,713 B2 | 4/2009 | Miyairi et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,749,820 B2 | 7/2010 | Miyairi |
| 7,800,114 B2 | 9/2010 | Okamoto |
| 7,821,002 B2 | 10/2010 | Yamazaki et al. |
| 7,884,360 B2 | 2/2011 | Takechi et al. |
| 7,888,207 B2 | 2/2011 | Wager, III et al. |
| 7,893,495 B2 | 2/2011 | Li et al. |
| 7,910,490 B2 | 3/2011 | Akimoto et al. |
| 7,910,920 B2 | 3/2011 | Park et al. |
| 7,932,521 B2 | 4/2011 | Akimoto et al. |
| 7,994,500 B2 | 8/2011 | Kim et al. |
| 8,058,645 B2 | 11/2011 | Jeong et al. |
| 8,129,719 B2 | 3/2012 | Yamazaki et al. |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,164,090 B2 | 4/2012 | Iwasaki et al. |
| 8,174,021 B2 | 5/2012 | Oikawa et al. |
| 8,183,099 B2 | 5/2012 | Sakata |
| 8,188,480 B2 | 5/2012 | Itai |
| 8,202,365 B2 | 6/2012 | Umeda et al. |
| 8,203,143 B2 | 6/2012 | Imai |
| 8,232,551 B2 | 7/2012 | Kim et al. |
| 8,274,077 B2 | 9/2012 | Akimoto et al. |
| 8,274,078 B2 | 9/2012 | Itagaki et al. |
| 8,420,442 B2 | 4/2013 | Takechi et al. |
| 8,492,756 B2 | 7/2013 | Sakata et al. |
| 8,614,442 B2 | 12/2013 | Park et al. |
| 8,785,929 B2 | 7/2014 | Sakata et al. |
| 8,822,264 B2 | 9/2014 | Yamazaki et al. |
| 8,889,480 B2 | 11/2014 | Takechi et al. |
| 9,040,985 B2 | 5/2015 | Sakata et al. |
| 2001/0041438 A1 | 11/2001 | Maeda et al. |
| 2001/0046027 A1 | 11/2001 | Tai et al. |
| 2001/0049163 A1 | 12/2001 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0145396 A1 | 6/2007 | Watanabe et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1* | 8/2008 | Park ................ H01L 29/78609 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1* | 12/2008 | Ryu ................ H01L 21/02554 257/43 |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0072321 A1 | 3/2009 | Arao et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0051940 A1* | 3/2010 | Yamazaki .......... H01L 29/4908 257/43 |
| 2010/0051949 A1 | 3/2010 | Yamazaki et al. |
| 2010/0065844 A1 | 3/2010 | Tokunaga |
| 2010/0084652 A1 | 4/2010 | Yamazaki et al. |
| 2010/0084655 A1 | 4/2010 | Iwasaki et al. |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0187523 A1 | 7/2010 | Sakata et al. |

(56) References Cited

U.S. PATENT DOCUMENTS

| | | |
|---|---|---|
| 2010/0193782 A1 | 8/2010 | Sakata |
| 2010/0224872 A1 | 9/2010 | Kimura |
| 2010/0224878 A1* | 9/2010 | Kimura .............. H01L 27/1225 257/57 |
| 2010/0230683 A1 | 9/2010 | Miyairi |
| 2010/0233847 A1 | 9/2010 | Ohara et al. |
| 2010/0295037 A1 | 11/2010 | Hironaka |
| 2010/0320458 A1 | 12/2010 | Umeda et al. |
| 2010/0320459 A1 | 12/2010 | Umeda et al. |
| 2011/0003430 A1 | 1/2011 | Yamazaki et al. |
| 2011/0012106 A1 | 1/2011 | Yamazaki et al. |
| 2011/0012118 A1* | 1/2011 | Yamazaki .......... H01L 27/1225 257/59 |
| 2011/0017995 A1 | 1/2011 | Yamazaki et al. |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0027980 A1 | 2/2011 | Yamazaki et al. |
| 2011/0031491 A1 | 2/2011 | Yamazaki et al. |
| 2011/0031492 A1 | 2/2011 | Yamazaki et al. |
| 2011/0031493 A1 | 2/2011 | Yamazaki et al. |
| 2011/0031499 A1 | 2/2011 | Kimura et al. |
| 2011/0037068 A1 | 2/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0133180 A1 | 6/2011 | Yamazaki |
| 2011/0147737 A1 | 6/2011 | Yamazaki et al. |
| 2011/0147750 A1 | 6/2011 | Yamazaki |
| 2011/0163311 A1 | 7/2011 | Akimoto et al. |
| 2011/0193083 A1 | 8/2011 | Kim et al. |
| 2011/0215328 A1 | 9/2011 | Morosawa et al. |
| 2011/0278577 A1 | 11/2011 | Yamazaki |
| 2011/0312111 A1 | 12/2011 | Yamazaki et al. |
| 2012/0119205 A1 | 5/2012 | Taniguchi et al. |
| 2012/0168750 A1 | 7/2012 | Hayashi et al. |
| 2012/0175608 A1 | 7/2012 | Yamazaki |
| 2012/0175609 A1 | 7/2012 | Yamazaki |
| 2012/0175610 A1 | 7/2012 | Yamazaki |
| 2012/0178224 A1 | 7/2012 | Yamazaki |
| 2012/0178249 A1 | 7/2012 | Yamazaki |
| 2015/0050774 A1 | 2/2015 | Yamazaki et al. |
| 2015/0056747 A1 | 2/2015 | Takechi et al. |
| 2015/0084048 A1 | 3/2015 | Hayashi et al. |

FOREIGN PATENT DOCUMENTS

| | | |
|---|---|---|
| CN | 101630692 A | 1/2010 |
| EP | 1209748 A | 5/2002 |
| EP | 1737044 A | 12/2006 |
| EP | 1921681 A | 5/2008 |
| EP | 2146379 A | 1/2010 |
| EP | 2175493 A | 4/2010 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-280637 A | 10/1992 |
| JP | 05-251705 A | 9/1993 |
| JP | 06-275697 A | 9/1994 |
| JP | 07-231094 A | 8/1995 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-050405 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2007-096055 A | 4/2007 |
| JP | 2007-123861 A | 5/2007 |
| JP | 2007-220816 A | 8/2007 |
| JP | 2008-042088 A | 2/2008 |
| JP | 2008-098637 A | 4/2008 |
| JP | 2008-103666 A | 5/2008 |
| JP | 2008-544522 | 12/2008 |
| JP | 2009-135380 A | 6/2009 |
| JP | 2009-224479 A | 10/2009 |
| JP | 2009-231613 A | 10/2009 |
| JP | 2010-016347 A | 1/2010 |
| JP | 4415062 | 2/2010 |
| JP | 2010-067954 A | 3/2010 |
| JP | 2010-080947 A | 4/2010 |
| JP | 2010-093070 A | 4/2010 |
| JP | 2010-177431 A | 8/2010 |
| JP | 2010-192881 A | 9/2010 |
| JP | 4571221 | 10/2010 |
| JP | 2010-272663 A | 12/2010 |
| JP | 2012-160679 A | 8/2012 |
| TW | 201044595 | 12/2010 |
| WO | WO-2004/038757 | 5/2004 |
| WO | WO-2004/114391 | 12/2004 |
| WO | WO-2006/138072 | 12/2006 |
| WO | WO-2008/069056 | 6/2008 |
| WO | WO-2008/069255 | 6/2008 |
| WO | WO-2008/133345 | 11/2008 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and SC2O3—A2O3—BO Systems [A; Fe, Ga, or Al; B; Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUs on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advance Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1016.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

(56) References Cited

OTHER PUBLICATIONS

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2006, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.

Taiwanese Office Action (Application No. 101100175) dated Sep. 8, 2015.

Chinese Office Action (Application No. 201210021268.4) dated Sep. 15, 2015.

Chinese Office Action (Application No. 201210021268.4) dated May 18, 2016.

\* cited by examiner

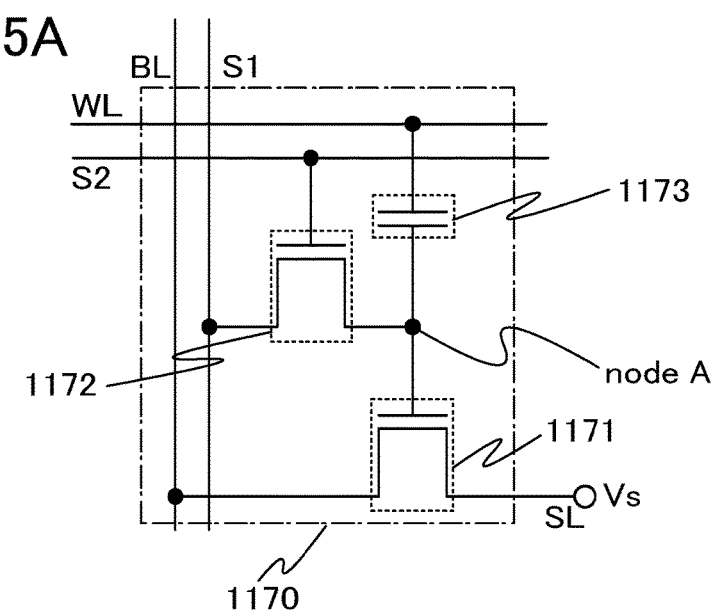

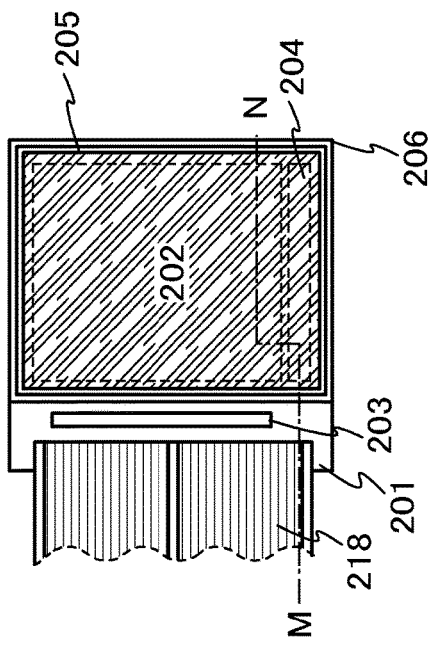
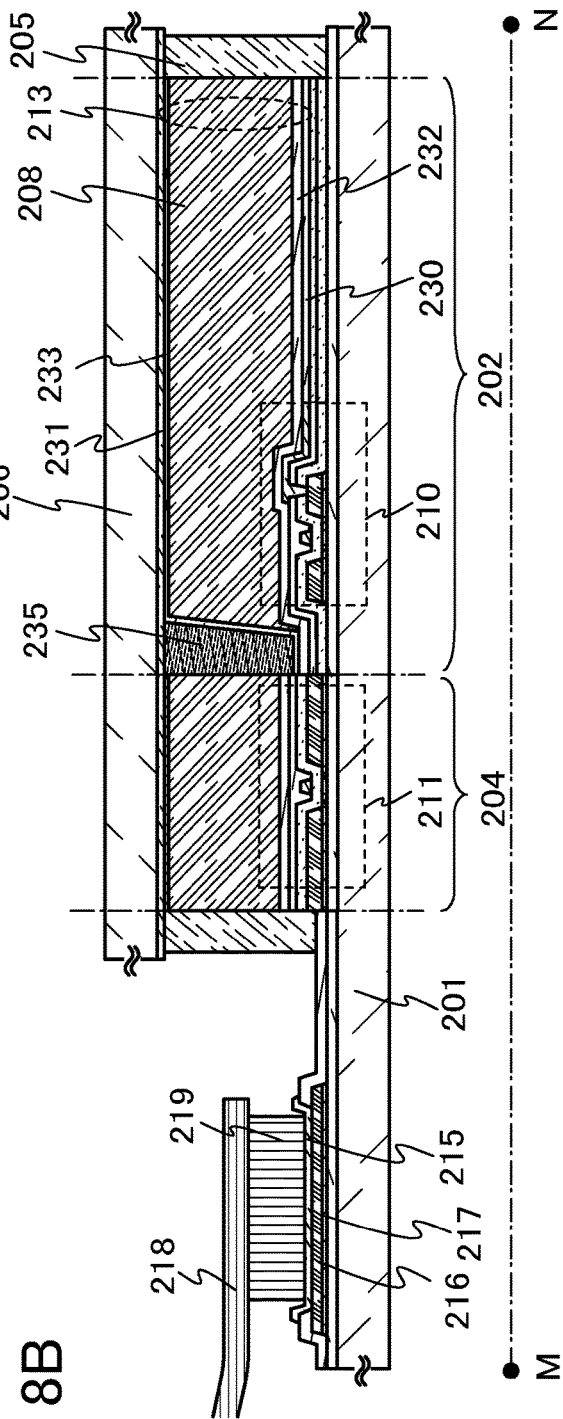
FIG. 8A
FIG. 8B

FIG. 10A1
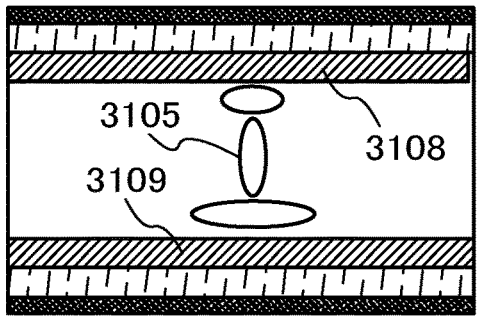
FIG. 10A2
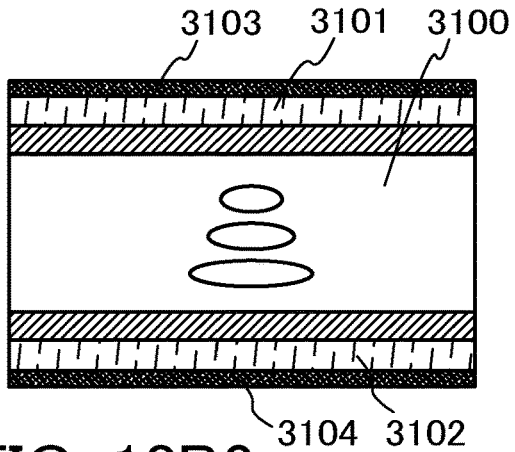
FIG. 10B1
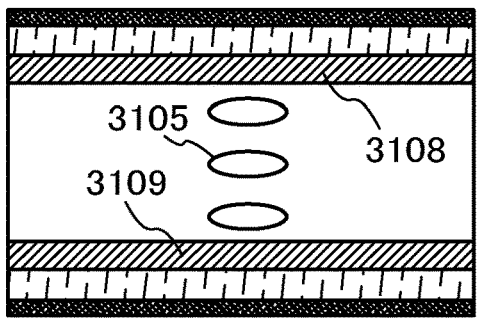
FIG. 10B2
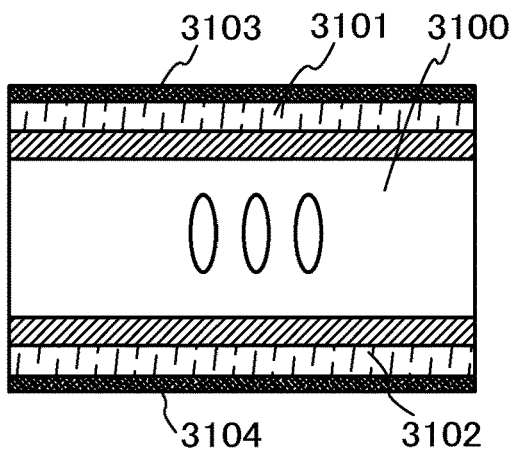
FIG. 10C1
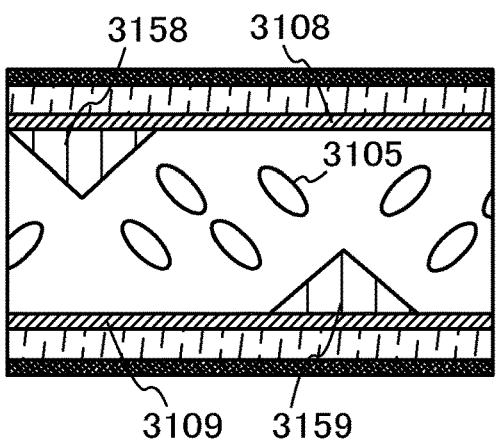
FIG. 10C2
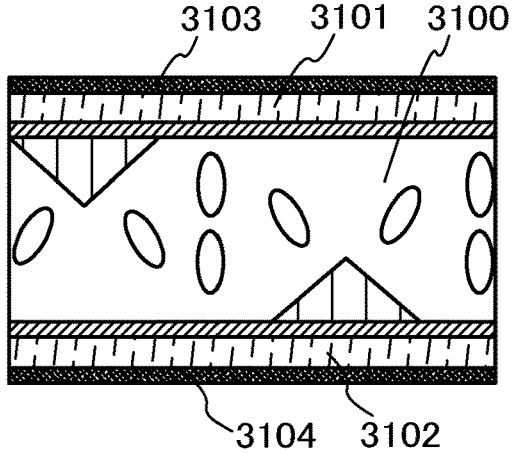

FIG. 11A1
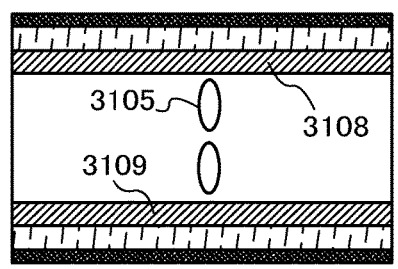
FIG. 11A2
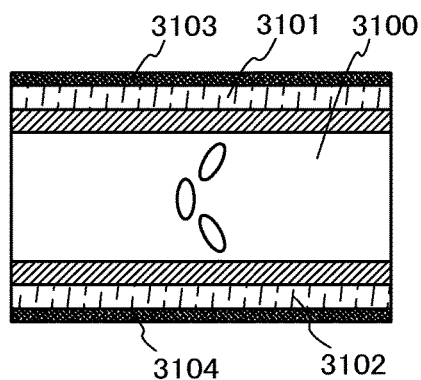
FIG. 11B1
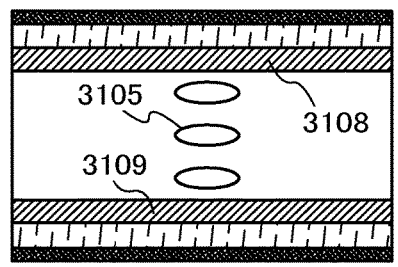
FIG. 11B2
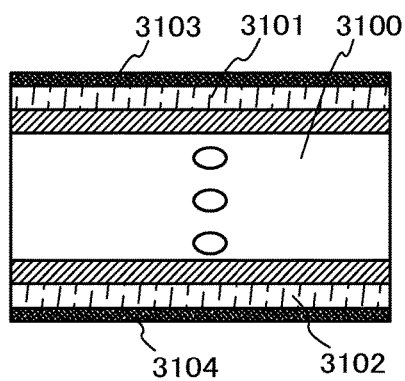

FIG. 12A1
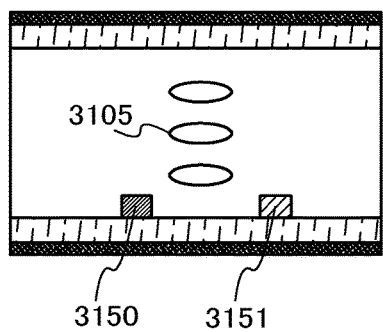
3150  3151
FIG. 12B1
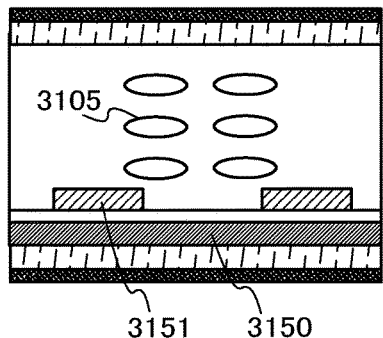
3151  3150
FIG. 12A2
3103  3101  3100
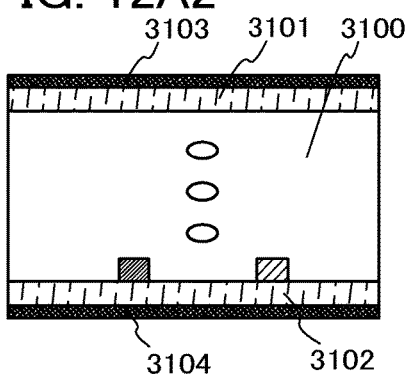
3104  3102
FIG. 12B2
3103  3101  3100
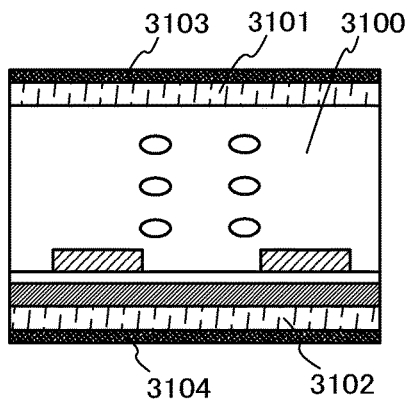
3104  3102

FIG. 18A (100)
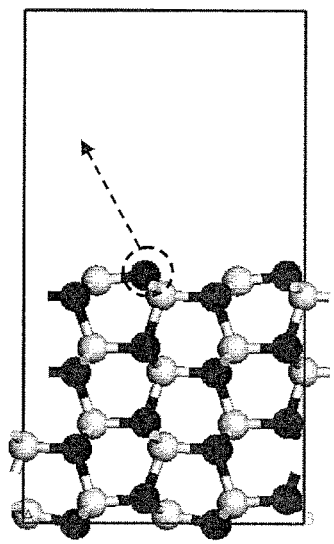
FIG. 18B (110)
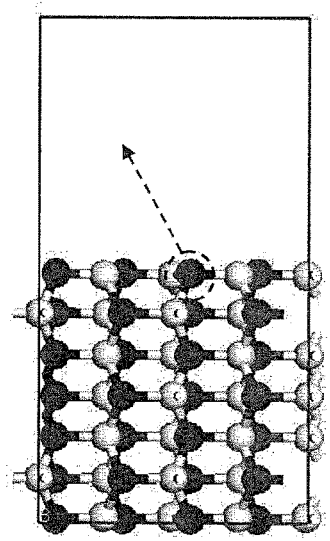
FIG. 18C (001)
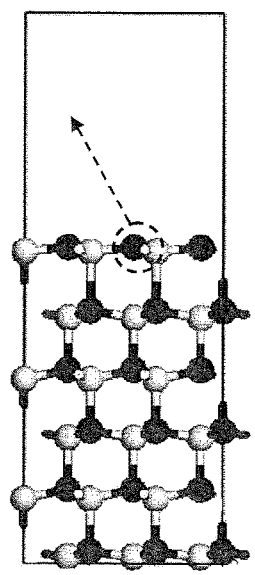

METHOD FOR MANUFACTURING SEMICONDUCTOR DEVICE

BACKGROUND OF THE INVENTION

1. Field of the Invention

The present invention relates to a method for manufacturing a semiconductor device which is provided with a circuit including a semiconductor element such as a transistor. For example, the present invention relates to a power device which is mounted on a power supply circuit; a semiconductor integrated circuit including a memory, a thyristor, a converter, an image sensor, or the like; and an electronic device on which an electro-optical device typified by a liquid crystal display panel, a light-emitting display device including a light-emitting element, or the like is mounted as a component.

In this specification, a semiconductor device generally refers to a device which can function by utilizing semiconductor characteristics; an electro-optical device, a light-emitting display device, a semiconductor circuit, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although a transistor manufactured using amorphous silicon has low field-effect mobility, it can be formed over a larger glass substrate. On the other hand, although a transistor manufactured using polycrystalline silicon has high field-effect mobility, it cannot be formed over a larger glass substrate.

Other than the transistors manufactured using silicon, in recent years, a technique in which transistors are manufactured using an oxide semiconductor and applied to electronic devices or optical devices has attracted attention. For example, a technique in which a transistor is manufactured using zinc oxide or an In—Ga—Zn—O-based oxide as an oxide semiconductor and used for a switching element of a pixel of a display device or the like is disclosed in Patent Document 1 and Patent Document 2.

REFERENCE

Patent Document

[Patent Document 1] Japanese Published Patent Application No. 2007-123861
[Patent Document 2] Japanese Published Patent Application No. 2007-096055

SUMMARY OF THE INVENTION

It is an object to provide a transistor in which an oxide semiconductor film is used and the off-state current is very small. In addition, it is an object to provide a semiconductor device in which very low power consumption is achieved by employing the transistor.

A base insulating film is formed over a substrate, a first oxide semiconductor film is formed over the base insulating film, and heat treatment is performed. A conductive film is formed over the first oxide semiconductor film and processed to form a source electrode and a drain electrode. After a second oxide semiconductor film is formed by processing the first oxide semiconductor film, a gate insulating film covering the source electrode, the drain electrode, and the second oxide semiconductor film is formed without interposing any step, and a gate electrode is formed over the gate insulating film.

Alternatively, a base insulating film from which oxygen is released by heat treatment is formed over a substrate, a first oxide semiconductor film is formed over the base insulating film, a conductive film is formed over the first oxide semiconductor film, and heat treatment is performed. The conductive film is processed to form a source electrode and a drain electrode. After a second oxide semiconductor film is formed by processing the first oxide semiconductor film, a gate insulating film covering the source electrode, the drain electrode, and the second oxide semiconductor film is formed without interposing any step, and a gate electrode is formed over the gate insulating film.

One of technical ideas of the present invention is: covering side surfaces of the second oxide semiconductor film with the gate insulating film after forming the second oxide semiconductor film without interposing any step.

Now, in terms of a reduction in off-state current of the transistor, a current which flows along the side surface of the oxide semiconductor film is explained.

When the oxide semiconductor film is processed by etching treatment or the like, the side surface of the oxide semiconductor film becomes active.

When the side surface of the oxide semiconductor film is active, oxygen is readily extracted therefrom at a reduced pressure or in a reducing atmosphere, and oxygen deficiency is caused in the side surface of the oxide semiconductor film. In particular, when the temperature is high, oxygen deficiency is likely to be caused.

In addition, in etching of the oxide semiconductor film, for example, in dry etching, when the side surface of the oxide semiconductor film is exposed to plasma including chlorine radicals, fluorine radicals, or the like, a metal atom at the side surface of the oxide semiconductor film is bonded to the chlorine radial, the fluorine radical, or the like. It is considered that, at this time, the metal atom and the chlorine atom or the metal atom and the fluorine atom are bonded to each other and detached from the oxide semiconductor film, so that an oxygen atom which is bonded to the metal atom in the oxide semiconductor film becomes active. The activated oxygen atom is easily reacted and detached from the oxide semiconductor film. Therefore, oxygen deficiency is likely to be caused in the side surface of the oxide semiconductor film by plasma treatment such as dry etching.

Oxygen deficiency in the oxide semiconductor film serves as a donor and generates a carrier.

That is, oxygen deficiency makes the side surface of the oxide semiconductor film n-type, which causes a leakage current in the transistor.

In addition, a current which flows along the side surface of the oxide semiconductor film not only increases the off-state current of the transistor but also forms another transistor (parasitic transistor) in which the side surface of the oxide semiconductor film serves as a channel formation region and whose threshold voltage is different from that of the transistor in some cases.

In view of the above, after forming the second oxide semiconductor film, the second oxide semiconductor film is covered with the gate insulating film without interposing any step, whereby a current which flows along the side surface of the oxide semiconductor film can be reduced and the parasitic transistor can be prevented from being formed.

Since a current easily flows along the side surface of the oxide semiconductor film, preferably, a main surface (i.e., a top surface or a bottom surface) of each of the source electrode and the drain electrode is not in contact with the side surfaces of the oxide semiconductor film. For example, the source electrode and the drain electrode are provided over the oxide semiconductor film in regions that are on the inner side than the side surfaces of the oxide semiconductor film, whereby the main surface of each of the source electrode and the drain electrode can be prevented from being in direct contact with the side surfaces of the oxide semiconductor film.

In addition, an insulating film serving as a base of the oxide semiconductor film is formed using an insulating film from which oxygen is released by heat treatment, and oxygen is released from the insulating film before processing the oxide semiconductor film, so that oxygen is supplied to the oxide semiconductor film. In the case where the oxide semiconductor film is processed, oxygen released from the insulating film is diffused to the outside from a region which is not covered with the oxide semiconductor film. In order to suppress this phenomenon and supply oxygen to the oxide semiconductor film efficiently, oxygen is preferably released from the insulating film before the oxide semiconductor film is processed. Reducing oxygen deficiency in the oxide semiconductor film efficiently can suppress an increase in off-state current of the transistor due to oxygen deficiency.

An oxide semiconductor film including a crystal with c-axis alignment, which has a triangular or hexagonal atomic arrangement when seen from the direction of an a-b plane, a surface, or an interface and in which the direction of an a-axis or a b-axis is varied in the a-b plane is used for a channel formation region of the transistor.

Note that the above-described oxide semiconductor film may contain zinc. When zinc is contained, it becomes easy to form an oxide semiconductor film including a crystal with c-axis alignment, which has a triangular or hexagonal atomic arrangement when seen from the direction of the a-b plane, the surface, or the interface and in which the direction of the a-axis or the b-axis is varied in the a-b plane.

The oxide semiconductor film can be formed by stacking two kinds of films whose compositions are different from each other. Alternatively, the oxide semiconductor film can be formed by crystallizing the two kinds of films which are stacked, using heat treatment.

The oxide semiconductor film contains two or more kinds of elements selected from indium, gallium, zinc, tin, titanium, and aluminum.

The above-described oxide semiconductor film has a band gap of greater than or equal to 2.5 eV, preferably greater than or equal to 3.0 eV.

In the above-described oxide semiconductor film, hydrogen, an alkali metal, an alkaline earth metal, and the like are reduced and the concentration of impurities is very low. Therefore, in the oxide semiconductor film, carriers due to the impurities are unlikely to be generated.

The concentration of hydrogen contained in the oxide semiconductor film is lower than $5 \times 10^{18}/cm^3$, preferably lower than or equal to $1 \times 10^{18}/cm^3$, more preferably lower than or equal to $5 \times 10^{17}/cm^3$, still more preferably lower than or equal to $1 \times 10^{16}/cm^3$.

An alkali metal is not an element constituting an oxide semiconductor, and therefore, is an impurity. Also, an alkaline earth metal is an impurity in the case where an alkaline earth metal does not constitute an oxide semiconductor. An alkali metal, in particular, Na diffuses, as $Na^+$, into an insulating layer which is in contact with the oxide semiconductor film. Further, in the oxide semiconductor film, Na cleaves a bond between a metal and oxygen which constitute the oxide semiconductor and is inserted therebetween. As a result, for example, deterioration of characteristics of the transistor such as shift of a threshold voltage in the negative direction to lead to a normally-on state transistor or a reduction in field-effect mobility occurs; in addition, variation in characteristics is also caused. Such deterioration of characteristics of the transistor and variation in characteristics due to the impurity frequently appear when the concentration of hydrogen in the oxide semiconductor film is sufficiently low. Therefore, when the concentration of hydrogen in the oxide semiconductor film is lower than or equal to $1 \times 10^{18}/cm^3$, in particular lower than or equal to $1 \times 10^{17}/cm^3$, the concentration of the above impurity is preferably reduced. Specifically, a measurement value of the concentration of Na by secondary ion mass spectrometry is preferably lower than or equal to $5 \times 10^{16}/cm^3$, more preferably lower than or equal to $1 \times 10^{16}/cm^3$, still more preferably lower than or equal to $1 \times 10^{15}/cm^3$. In a manner similar to the above, a measurement value of the concentration of Li is preferably lower than or equal to $5 \times 10^{15}/cm^3$, more preferably lower than or equal to $1 \times 10^{15}/cm^3$. In a manner similar to the above, a measurement value of the concentration of K is preferably lower than or equal to $5 \times 10^{15}/cm^3$, more preferably lower than or equal to $1 \times 10^{15}/cm^3$.

When a channel formation region of a transistor is formed using the above-described oxide semiconductor film, the off-state current of the transistor can be reduced.

It is preferable that the gate electrode be formed so as not to overlap with the source electrode and the drain electrode. When the gate electrode does not overlap with the source electrode and the drain electrode, parasitic capacitance can be reduced, so that the transistor can operate at high speed.

Preferably, by addition of ions to the oxide semiconductor film with the use of the source electrode, the drain electrode, and the gate electrode as a mask, lightly doped drain (LDD) regions are provided in regions which are not covered by any of the gate electrode, the source electrode, and the drain electrode. With the LDD regions, hot-carrier degradation or the like can be suppressed. In addition, when the LDD regions do not overlap with any of the gate electrode, the source electrode, and the drain electrode, parasitic capacitance can be reduced, so that the transistor can operate at high speed.

The ions can be added to the oxide semiconductor film by using an ion implantation apparatus, an ion doping apparatus, or the like. An ion implantation apparatus with which the amount of impurities, such as hydrogen, that enter the oxide semiconductor film can be small is preferably used.

Ions of at least one kind of element selected from nitrogen, phosphorus, arsenic, and rare gases are added to the oxide semiconductor film.

It is possible to provide a transistor in which an oxide semiconductor film is used and whose off-state current is very small. In addition, it is possible to provide a semiconductor device in which very low power consumption is achieved by employing the transistor.

BRIEF DESCRIPTION OF THE DRAWINGS

FIGS. 5A and 5B are examples of a circuit diagram showing an embodiment of the present invention.

FIGS. 8A and 8B are a top view and a cross-sectional view illustrating an example of a display device according to an embodiment of the present invention.

FIGS. 10A1 to 10C2 are cross-sectional views each illustrating an example of an operation mode of liquid crystal according to an embodiment of the present invention.

FIGS. 11A1 to 11B2 are cross-sectional views each illustrating an example of an operation mode of liquid crystal according to an embodiment of the present invention.

FIGS. 12A1 to 12B2 are cross-sectional views each illustrating an example of an operation mode of liquid crystal according to an embodiment of the present invention.

FIGS. 18A to 18C are each a model of a crystal for describing an embodiment of the present invention.

DETAILED DESCRIPTION OF THE INVENTION

Figure 1A:
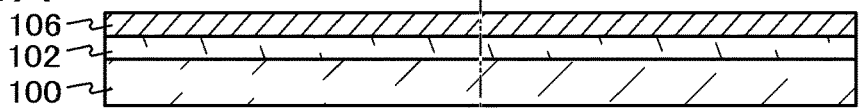
FIGS. 1A to 1H are cross-sectional views illustrating an example of a method for manufacturing a semiconductor device according to an embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to the description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Before the present invention is described, terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

A voltage refers to a potential difference between a given potential and a reference potential (e.g., a ground potential) in many cases. Accordingly, a voltage can also be called a potential.

Even when it is written in this specification that "to be connected", there is the case where no physical connection is made in an actual circuit and a wiring is only extended.

Note that the ordinal numbers such as "first" and "second" in this specification are used for convenience and do not denote the order of steps or the stacking order of layers. In addition, the ordinal numbers in this specification do not denote particular names which specify the invention.

Embodiment 1

In this embodiment, a semiconductor device according to an embodiment of the present invention and a manufacturing method thereof will be described with reference to a top view and cross-sectional views.

Figure 2A:
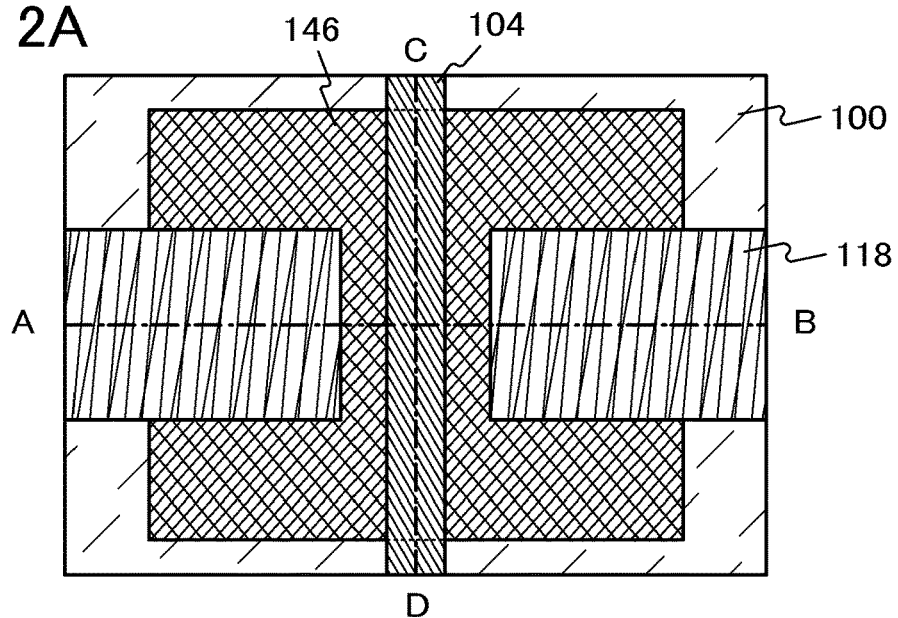
FIGS. 2A to 2C are a top view and cross-sectional views illustrating an example of a semiconductor device according to an embodiment of the present invention.
Figure 2B:
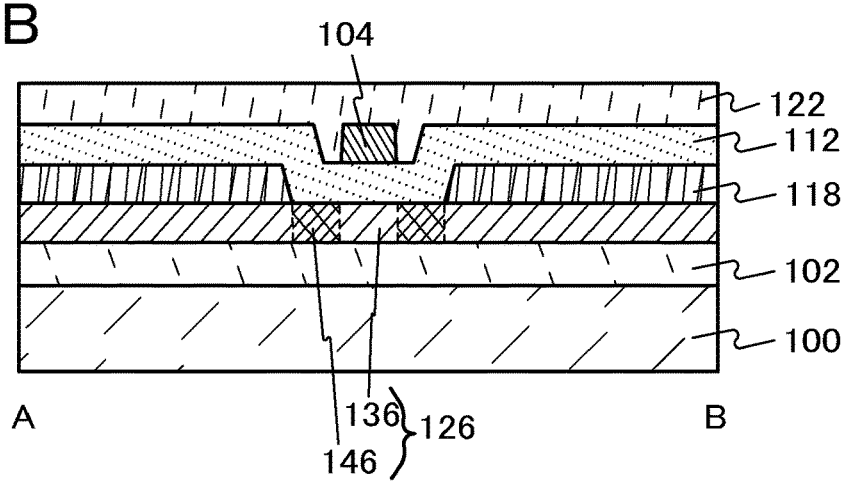
Figure 2C:
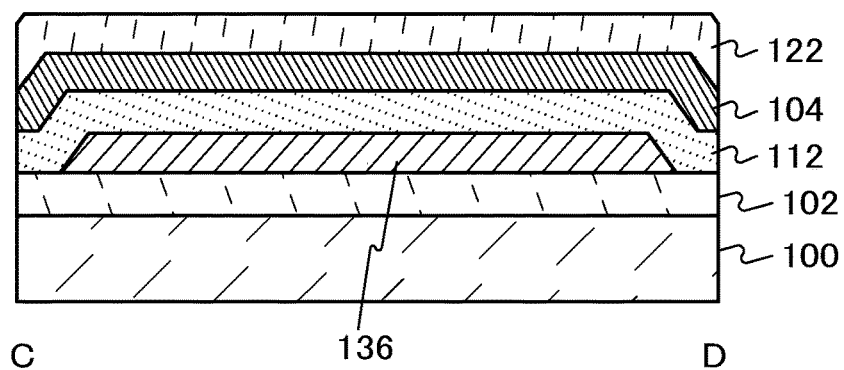

FIGS. 2A to 2C illustrate a semiconductor device according to an embodiment of the present invention. FIG. 2A is a top view of the semiconductor device, FIG. 2B is a cross-sectional view taken along alternate long and short dashed line A-B of FIG. 2A, and FIG. 2C is a cross-sectional view taken along alternate long and short dashed line C-D of FIG. 2A.

Note that some films are omitted in FIG. 2A for simplification.

In FIG. 2A, part of a top surface shape of source and drain electrodes 118 and part of a top surface shape of an oxide semiconductor film 126 substantially correspond to each other. In other words, whole source and drain electrodes 118 overlap with the oxide semiconductor film 126.

Here, a status that a top surface shape of one film and a top surface shape of another film substantially correspond to each other means a status that outlines of the films overlap with each other at least partly to form a line or a curve. However, the outlines do not overlap with each other and a film in an upper layer is formed on an inner side than a film in a lower layer or a film in an upper layer is formed on an outer side than a film in a lower layer in some cases; such a case is also included in a status that "a top surface shape of one film and a top surface shape of another film substantially correspond to each other".

FIG. 2B will be described. FIG. 2B illustrates a structure including a substrate 100, a base insulating film 102 over the substrate 100, the oxide semiconductor film 126 including a first region 136 and second regions 146 over the base insulating film 102, the source and drain electrodes 118 over the oxide semiconductor film 126, a gate insulating film 112 over the source and drain electrodes 118 and the oxide semiconductor film 126, a gate electrode 104 over the gate insulating film 112, and an interlayer insulating film 122 over the gate insulating film 112 and the gate electrode 104.

Next, FIG. 2C will be described. FIG. 2C illustrates a structure including the substrate 100, the base insulating film 102 over the substrate 100, the first region 136 of the oxide semiconductor film 126 over the base insulating film 102, the gate insulating film 112 covering the base insulating film 102 and the oxide semiconductor film 126, the gate electrode 104 over the gate insulating film 112, and the interlayer insulating film 122 over the gate electrode 104.

Next, a method for manufacturing the semiconductor device in FIGS. 2A to 2C will be described with reference to FIGS. 1A to 1H.

First, the base insulating film 102 and a first oxide semiconductor film 106 are formed in this order over the substrate 100 (see FIG. 1A).

There is no particular limitation on the substrate 100 as long as it has heat resistance enough to withstand at least heat treatment performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

A flexible substrate may alternatively be used as the substrate 100. In that case, a transistor is formed directly over a flexible substrate. Note that as a method for forming a transistor over a flexible substrate, there is also a method in which, after a non-flexible substrate is used as the substrate 100 and a transistor is formed thereover, the transistor is separated from the non-flexible substrate and transferred to a flexible substrate. In that case, a separation layer is preferably provided between the substrate 100 and the transistor.

The base insulating film 102 may be, for example, formed with a stacked layer or a single layer using one or more of silicon oxide, silicon oxynitride, silicon nitride oxide, silicon nitride, aluminum oxide, hafnium oxide, yttrium oxide, zirconium oxide, and the like. For example, the base insulating film 102 may be formed using a thermal oxidation method, a CVD method, a sputtering method, or the like. As the base insulating film 102, a film from which oxygen is released by heat treatment may be used. With the use of such a film from which oxygen is released by heat treatment for the base insulating film 102, defects generated in the first oxide semiconductor film 106 can be repaired, and electric characteristics of the transistor can be improved.

In this specification, silicon oxynitride refers to a substance which contains silicon, nitrogen, and oxygen and in which proportion of oxygen is higher than that of nitrogen. Silicon nitride oxide refers to a substance which contains silicon, oxygen, and nitrogen and in which proportion of nitrogen is higher than that of oxygen.

The base insulating film 102 is provided to prevent elements which adversely affect the transistor characteristics from being diffused from the substrate 100 to the first oxide semiconductor film 106. Hence, the base insulating film 102 is preferably formed using an insulating film in which the diffusion coefficient of the elements is low. This also applies to the gate insulating film 112 and the interlayer insulating film 122 described below.

To release oxygen by heat treatment means that the released amount of oxygen which is converted into oxygen atoms is estimated to be greater than or equal to $1.0 \times 10^{18}$ atoms/cm$^3$, or greater than or equal to $3.0 \times 10^{20}$ atoms/cm$^3$ in thermal desorption spectroscopy (TDS).

Here, a method to measure the amount of released oxygen using TDS analysis is described.

The total amount of released gases in TDS analysis is proportional to the integral value of intensity of ions of the released gases, and the total amount of released gases can be calculated by the comparison between the integral value of a measured sample and that of a standard sample.

For example, the number of released oxygen molecules ($N_{O2}$) from an insulating film can be found according to an equation 1 with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. CH$_3$OH, which is a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either, because the proportion of such a molecule in the natural world is minimal.

$$N_{O2} = N_{H2}/S_{H2} \times S_{O2} \times \alpha \quad \text{[Equation 1]}$$

$N_{H2}$ is the value obtained by conversion of the number of hydrogen molecules released from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of the Equation 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

In the above structure, the film from which oxygen is released by heat treatment may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 102 to the first oxide semiconductor film 106, the number of the interface states between the first oxide semiconductor film 106 and the base insulating film 102 can be reduced. As a result, carrier trapping at the interface between the first oxide semiconductor film 106 and the base insulating film 102 through operation of the transistor or the like can be suppressed, and thus the electric characteristics of the transistor can be improved.

Further, in some cases, electric charge is generated owing to oxygen deficiency in the oxide semiconductor film. In general, part of oxygen deficiency in an oxide semiconductor film serves as a donor to release an electron which is a carrier. As a result, the threshold voltage of the transistor shifts in the negative direction. When oxygen is sufficiently supplied from the base insulating film 102 to the first oxide semiconductor film 106, oxygen deficiency in the oxide semiconductor film which causes the negative shift of the threshold voltage can be reduced.

In other words, when a film from which oxygen is released by heat treatment is provided as the base insulating film 102, the interface state at the interface between the first oxide semiconductor film 106 and the base insulating film 102 and oxygen deficiency in the first oxide semiconductor film 106 can be reduced, so that the influence of carrier trapping at the interface between the first oxide semiconductor film 106 and the base insulating film 102 can be reduced.

Although the benefit obtained by using the base insulating film 102 is described above, the description may be also applied to the gate insulating film 112 and the interlayer insulating film 122. In that case, the second oxide semiconductor film 116 or the oxide semiconductor film 126 enjoy a benefit similar to that of the first oxide semiconductor film 106.

As the first oxide semiconductor film 106, a c-axis aligned crystalline oxide semiconductor (CAAC-OS) is preferably used. The first oxide semiconductor film 106 is not limited to CAAC-OS and may also be formed using an amorphous oxide semiconductor film.

CAAC-OS is an oxide semiconductor including a crystal with c-axis alignment which has a triangular or hexagonal atomic arrangement when seen from the direction of an a-b plane, a surface, or an interface and in which metal atoms are arranged in a layered manner, or metal atoms and oxygen atoms are arranged in a layered manner along a c-axis, and the direction of the a-axis or the b-axis is varied in the a-b plane (or the surface or the interface), that is, which rotates around the c-axis.

In a broad sense, CAAC-OS means a non-single-crystal material including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis.

CAAC-OS is not a single crystal, but this does not mean that CAAC-OS is composed of only an amorphous component. Although CAAC-OS includes a crystallized portion (crystalline portion), a boundary between one crystalline portion and another crystalline portion is not clear in some cases.

Nitrogen may be substituted for part of oxygen included in CAAC-OS. The c-axes of individual crystalline portions included in CAAC-OS may be aligned in one direction (e.g., the direction perpendicular to a surface of a substrate over which CAAC-OS is formed, a surface of CAAC-OS, or the like). Alternatively, the normals of the a-b planes of the individual crystalline portions included in CAAC-OS may be aligned in one direction (the direction perpendicular to a surface of a substrate over which CAAC-OS is formed, a surface of CAAC-OS, or the like).

CAAC-OS becomes a conductor or an insulator depending on its composition or the like. CAAC-OS transmits or does not transmit visible light depending on its composition or the like.

Next, a method for forming CAAC-OS is described.

First, an oxide semiconductor film is formed by a sputtering method, a molecular beam epitaxy method, an atomic layer deposition method, or a pulsed laser deposition method. Note that by heating the substrate when the oxide semiconductor film is formed, an oxide semiconductor film in which the proportion of a crystal region is high can be obtained. For example, the substrate temperature may be higher than or equal to 150° C. and lower than or equal to 450° C., preferably higher than or equal to 200° C. and lower than or equal to 350° C.

Next, first heat treatment may be performed. By performing the first heat treatment, an oxide semiconductor film in which the proportion of a crystal region is high can be formed. The first heat treatment may be performed at a temperature of higher than or equal to 200° C. and lower than the strain point of the substrate, and is preferably performed at a temperature of higher than or equal to 250° C. and lower than or equal to 450° C. The first heat treatment is performed in an oxidizing atmosphere, an inert atmosphere, or a reduced-pressure atmosphere, but the atmosphere is not limited thereto. The treatment time is 3 minutes to 24 hours. As the treatment time is increased, the proportion of a crystal region in the oxide semiconductor film can be increased. Note that heat treatment for longer than 24 hours is not preferable because the productivity is reduced.

The oxidizing atmosphere is an atmosphere containing an oxidizing gas. Examples of the oxidizing gas include oxygen, ozone, nitrous oxide, and the like, and it is preferable that the oxidizing gas do not contain water, hydrogen, and the like. For example, the purity of oxygen, ozone, or nitrous oxide to be introduced into a heat treatment apparatus is higher than or equal to 8N (99.999999%), preferably higher than or equal to 9N (99.9999999%) (the concentration of impurities is lower than or equal to 10 ppb, preferably lower than 0.1 ppb). As the oxidizing atmosphere, an oxidizing gas and an inert gas may be mixed to be used. In that case, the atmosphere contains an oxidizing gas at a concentration of at least higher than or equal to 10 ppm.

Here, an inert atmosphere refers to an atmosphere containing an inert gas such as nitrogen or a rare gas (e.g., helium, neon, argon, krypton, or xenon) as a main component. Specifically, in an inert atmosphere, the concentration of a reactive gas such as an oxidizing gas is lower than 10 ppm.

For the first heat treatment, a rapid thermal annealing (RTA) apparatus can be used. With the use of the RTA apparatus, only in a short time, the heat treatment can be performed at a temperature of higher than or equal to the strain point of the substrate. Thus, the time required for formation of an oxide semiconductor film in which the ratio of a crystal region to an amorphous region is high can be shortened.

For the oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. In addition, any of the above materials may contain silicon oxide. Here, for example, an In—Ga—Zn—O-based material means an oxide containing indium (In), gallium (Ga), and zinc (Zn), and there is no particular limitation on the composition ratio. Further, the In—Ga—Zn—O-based material may contain an element other than In, Ga, and Zn. At this time, the amount of oxygen is preferably in excess of stoichiometry in the oxide semiconductor film. When the amount of oxygen is in excess of stoichiometry, generation of carriers which results from oxygen deficiency in the oxide semiconductor film can be suppressed.

For example, in the case where an In—Zn—O-based material is used for the oxide semiconductor film, the atomic ratio thereof is In/Zn=0.5 to 50, preferably In/Zn=1 to 20, more preferably In/Zn=3 to 15. When the atomic ratio of Zn is in the above range, the field-effect mobility of the transistor can be improved. Here, when the atomic ratio of the compound is In:Zn:O=X:Y:Z, the relation of Z>1.5X+Y is satisfied.

A material represented by a chemical formula, $InMO_3(ZnO)_m$ (m>0) may also be used as the oxide semiconductor film. Here, M represents one or more metal elements selected from Ga, Al, Mn, and Co. For example, M may be Ga, Ga and Al, Ga and Mn, Ga and Co, or the like.

In addition, an In—Ga—Zn—O-based material containing nitrogen at a concentration of higher than or equal to $1 \times 10^{17}$ atoms/cm$^3$ and lower than or equal to $5 \times 10^{19}$ atoms/cm$^3$, preferably lower than or equal to $5 \times 10^{18}$ atoms/cm$^3$, becomes an oxide having a c-axis-aligned hexagonal crystal structure which includes one layer containing Ga and Zn between an In—O crystal plane (a crystal plane including indium and oxygen) and another In—O crystal plane (a crystal plane including indium and oxygen). Alternatively, in the In—Ga—Zn—O-based oxide semiconductor film containing nitrogen in the above range, a plurality of layers including Ga and Zn may be provided between the adjacent In—O crystal planes.

Next, a second oxide semiconductor film may be formed over the oxide semiconductor film, whereby a stack of oxide semiconductor films may be formed. The second oxide semiconductor film can be formed by a method similar to that of the first oxide semiconductor film.

When the substrate is heated while the second oxide semiconductor film is formed, the second oxide semiconductor film can be crystallized with the use of the first oxide semiconductor film as a seed crystal. At this time, to compose the first oxide semiconductor film and the second oxide semiconductor film using the same kind of element is referred to as "homo-growth". Alternatively, to compose the first oxide semiconductor film and the second oxide semiconductor film using elements, at least one kind of which differs between the first oxide semiconductor film and the second oxide semiconductor film, is referred to as "hetero-growth".

Note that second heat treatment may be performed after the second oxide semiconductor film is formed. The second heat treatment may be performed by a method similar to that of the first heat treatment. With the second heat treatment, a stacked-layer structure in which the ratio of a crystal region to an amorphous region is high can be obtained. Further, with the second heat treatment, the second oxide semiconductor film can be crystallized with the use of the first oxide semiconductor film as a seed crystal. At this time, homo-growth in which the first and second oxide semiconductor films are composed of the same element may be caused. Alternatively, hetero-growth in which the first oxide semiconductor film and the second oxide semiconductor film are composed of elements, at least one kind of which differs between the first oxide semiconductor film and the second oxide semiconductor film, may be caused.

Through the above steps, CAAC-OS can be formed.

In the first heat treatment and the second heat treatment in the process for forming CAAC-OS, oxygen may be supplied from the base insulating film 102 to the first oxide semiconductor film 106.

Third heat treatment may be performed after formation of the first oxide semiconductor film 106. The third heat treatment is performed at a temperature of higher than or equal to 150° C. and lower than the strain point of the substrate, preferably higher than or equal to 250° C. and lower than or equal to 450° C., more preferably higher than or equal to 300° C. and lower than or equal to 450° C. In the third heat treatment, oxygen can be supplied from the base insulating film 102 to the first oxide semiconductor film 106. The third heat treatment is performed in a reduced pressure atmosphere, an inert atmosphere, or an oxidizing atmosphere.

Figure 1B:
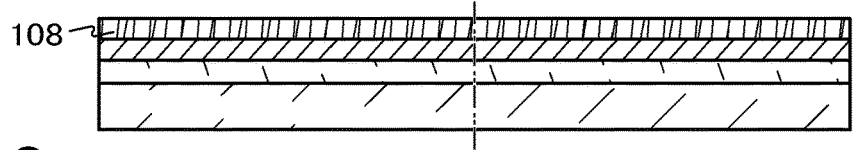
Figure 1C:
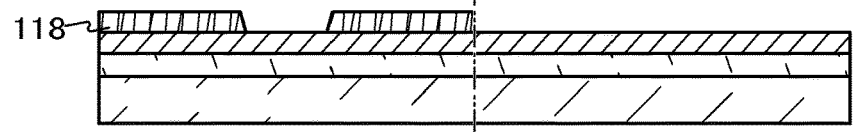

A conductive film 108 is formed over the first oxide semiconductor film 106 (see FIG. 1B).

The conductive film 108 may be formed to have a single-layer structure or a stacked-layer structure, using at least one of the following materials: Al, Ti, Cr, Co, Ni, Cu, Y, Zr, Mo, Ag, Ta, and W; a nitride of any of these elements; an oxide of any of these elements; and an alloy of any of these elements. An oxide conductive film has higher resistance than a metal film and thus is preferably stacked over/below a low-resistance film with a sheet resistance of lower than or equal to 10 Ω/sq in order to reduce the resistance of the conductive film 108.

Fourth heat treatment may be performed after formation of the conductive film 108. The fourth heat treatment may be performed by a method similar to that of the third heat treatment. In the fourth heat treatment, oxygen can be supplied from the base insulating film 102 to the first oxide semiconductor film 106.

Next, a resist is applied to the conductive film 108, and a resist mask is formed by a photolithography method. The conductive film 108 is processed with the use of the resist mask, so that the source and drain electrodes 118 are formed (see FIG. 1C).

Next, a resist is applied to the first oxide semiconductor film 106, and a resist mask is formed by a photolithography method. The first oxide semiconductor film 106 is processed with the use of the resist mask, so that the second oxide semiconductor film 116 is formed (see FIG. 1D). Hence, it is possible to prevent bottom surfaces of the source and drain electrodes 118 from being in direct contact with the side surface of the second oxide semiconductor film 116.

Figure 1D:
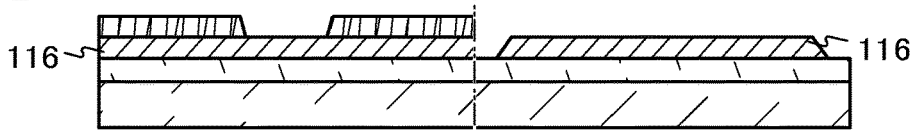

Alternatively, a resist mask obtained by using a multi-tone mask may be used to process the conductive film 108 and the first oxide semiconductor film 106. In that case, by using the multi-tone mask, a first resist mask which includes a first resist region and a second resist region having different thicknesses is formed. In the first resist mask, the thickness of the second resist region is larger than the thickness of the first resist region. First, the conductive film 108 is processed with the use of the first resist mask into a shape corresponding to the first resist region and the second resist region, so that the source and drain electrodes 118 are formed. Then, the first resist mask is reduced in size by plasma treatment such as ashing to remove the first resist region, so that a second resist mask including only the second resist region is formed. Then, the first oxide semiconductor film 106 is further processed with the use of the second resist mask, so that a shape illustrated in FIG. 1D is obtained.

Here, the resist mask may be removed by plasma treatment such as ashing. The resist mask is preferably removed by ashing, in which case oxygen deficiency is less likely to be caused at the side surface of the second oxide semiconductor film 116 compared to the case where a stripping solution is used.

When the conductive film 108 and the first oxide semiconductor film 106 are processed through the above process, part of the second oxide semiconductor film 116 is left below the processed conductive film 108. In other words, the whole of the processed conductive film 108 overlaps with part of the second oxide semiconductor film 116. Thus, in the case where the processed conductive film 108 also serves as a wiring, electric charge accumulated at an intersecting region of the wiring and another wiring can be reduced. Therefore, signal delay and the like can be suppressed.

Figure 1E:
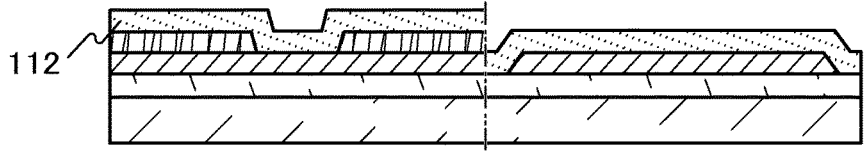

Then, the gate insulating film 112 is formed so as to cover the source and drain electrodes 118 and the second oxide semiconductor film 116 (see FIG. 1E). The gate insulating film 112 is preferably formed immediately after the second oxide semiconductor film 116 is formed. This is to reduce oxygen deficiency, which is caused at the side surface of the second oxide semiconductor film 116, with the use of the gate insulating film 112.

Figure 17:
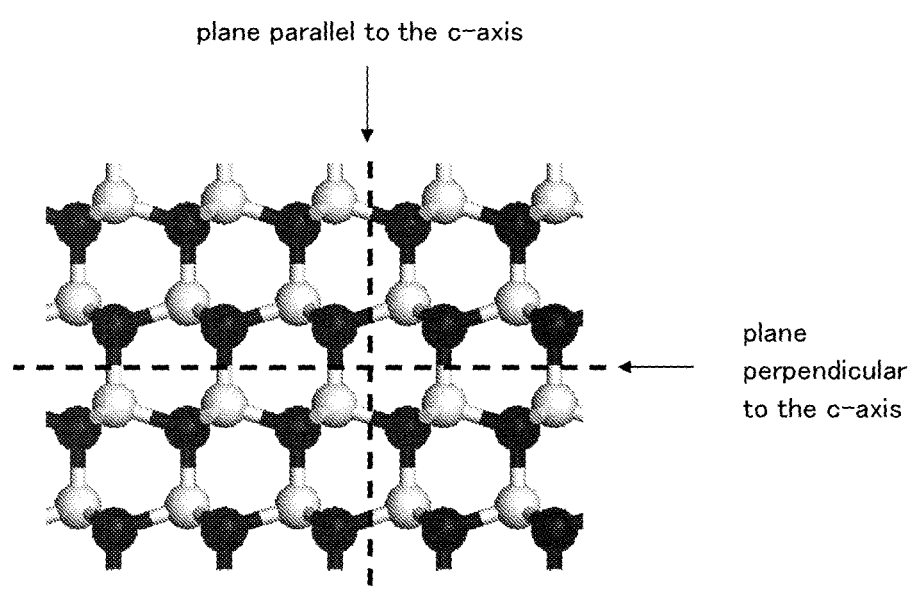
FIG. 17 is a model of a crystal for describing an embodiment of the present invention.

Here, verification results on how easily oxygen deficiency is caused at a top surface and a side surface of an oxide semiconductor film, obtained through calculation using a model, will be described. Note that CAAC-OS is complicated to calculate due to a plurality of crystal planes on one side surface. Therefore, calculation was conducted here using a ZnO single crystal that has a wurtzite structure having c-axis alignment. As crystal models, the (001) plane, the (100) plane, and the (110) plane obtained by cutting the crystal lattice along planes parallel to the c-axis and a plane perpendicular to the c-axis as illustrated in FIG. 17 were used.

After making the surface structures, calculation of the cases where oxygen is released from the (100) plane, the (110) plane, and the (001) plane as illustrated in FIGS. 18A to 18C was conducted, and the easiness of release of oxygen was compared among these planes.

A model was made by cutting the crystal lattice to have the (001) plane on the surface. Since the calculation was conducted using a three-dimensional periodic structure, the model was a slab model having two (001) planes and having a vacuum region of 1 nm. Similarly, a slab model having the (100) plane on the surface and a slab model having the (110) plane on the surface were made as examples of the side surface because the side surface is assumed to be perpendicular to the (001) plane. By calculating these two planes, a tendency to release oxygen from planes perpendicular to the (001) plane can be analyzed. In this case also, the vacuum region is 1 nm. The number of atoms in the (100) plane model, the (110) plane model, and the (001) plane model were set to be 64, 108, and 108, respectively. Further, an oxygen atom is removed from a surface of each of the above three structures to make other structures.

For the calculation, CASTEP, which is a program using the density functional theory, was used. A plane wave basis pseudopotential method was used as a method for the density functional theory, and GGA-PBE was used for a functional. First, in a four-atom unit cell of a wurtzite structure, the structure including a lattice constant was optimized. Next, based on the optimized structure, the surface structure was made. Then, the surface structure with oxygen deficiency and the surface structure without oxygen deficiency were subjected to structure optimization with a lattice constant fixed. Energy after the structure optimization was used.

The cut-off energy was assumed to be 380 eV in unit cell calculation and 300 eV in surface structure calculation. As the k-point, a grid size of 9×9×6, a grid size of 3×2×1, and a grid size of 1×2×2 were used for the calculations of the (100) plane model, the (110) plane model, and the (001) plane model, respectively.

The following calculation was performed on the above surface structures to obtain an energy difference (here, referred to as a bound energy): the energy of the structure with oxygen deficiency and half the energy of an oxygen molecule are added, and the energy of the structure without oxygen deficiency is subtracted therefrom. Oxygen is more likely to be released on the surface having a lower bound energy.

(Bound energy)=(Energy of the structure with oxygen deficiency)+(Half the energy of an oxygen molecule)−(Energy of the structure without oxygen deficiency)     [Equation 2]

Bound energies of the respective surfaces obtained according to Equation 2 are shown in Table 1.

TABLE 1

|  | Bound energy |
|---|---|
| (100) plane model | 2.89 |
| (110) plane model | 2.64 |
| (001) plane model | 3.38 |

From the result in Table 1, it can be said that bound energies of the (100) plane and the (110) plane are lower than that of the (001) plane and oxygen is more likely to be released from the (100) plane and the (110) plane than from the (001) plane. In other words, it is found that oxygen is more likely to be released from the side surface than the top surface of the ZnO film having c-axis alignment in a direction perpendicular to the top surface. Although ZnO which is an example of CAAC-OS has mixed various crystal planes, it has the same kind of plane as a ZnO single crystal on its side surface. Therefore, it can be said that a tendency to release oxygen of the ZnO is similar to that of the ZnO single crystal.

Therefore, the gate insulating film 112 is preferably formed using an insulating film from which oxygen is released by heat treatment. For example, the gate insulating film 112 may be formed of a material similar to that of the base insulating film 102.

Figure 1F:
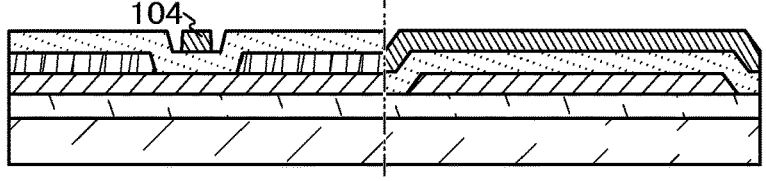

Next, the gate electrode 104 is formed over the gate insulating film 112 (see FIG. 1F). The gate electrode 104 is provided so as not to overlap with the source and drain electrodes 118. When the gate electrode does not overlap with the source and drain electrodes, parasitic capacitance can be reduced, so that the transistor can operate at high speed. The gate electrode 104 may be formed by processing any of the materials that can be used for the conductive film 108.

Alternatively, the gate electrode 104 may be formed using an oxide film containing at least one of Al, Si, Ti, Ni, Cu, Zn, Ga, Ge, In, Sn, and W. The oxide film may contain nitrogen at higher than or equal to $5 \times 10^{19}$ atoms/cm$^3$ and lower than or equal to 20 at. %, preferably higher than or equal to $1 \times 10^{20}$ atoms/cm$^3$ and lower than or equal to 7 at. %. For example, an oxide film which contains In, Ga, and Zn and further contains nitrogen at higher than or equal to $1 \times 10^{20}$ atoms/cm$^3$ and lower than or equal to 7 at. % may be used. When the above oxide film is used, a stack of the oxide film and a metal film is preferably used for the gate electrode 104. At this time, the oxide film is provided in contact with the gate insulating film 112. Since the range of the work function of the oxide film is wider than that of the metal film, controllability of the threshold voltage of the transistor can be increased.

Figure 1G:
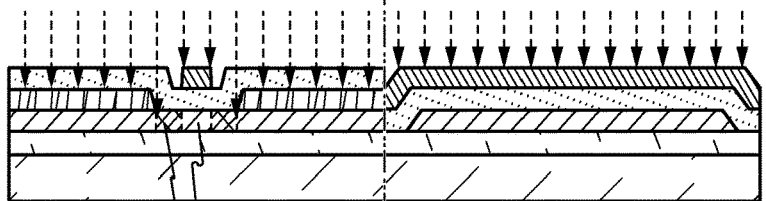

Then, ions are optionally added to the second oxide semiconductor film 116 through the gate insulating film 112 with the use of the source and drain electrodes 118 and the gate electrode 104 as a mask, so that the oxide semiconductor film 126 including the first region 136 to which the ions are not added and the second regions 146 to which the ions are added is formed (see FIG. 1G). At least one kind of element selected from nitrogen, phosphorus, arsenic, and rare gases is added to the second regions at a concentration of higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than or equal to $5\times10^{19}$ atoms/cm$^3$. Note that the ions to be added are not limited to ions of the above element, and ions of an element which can reduce resistance of the second oxide semiconductor film 116 can be used. By adding the ions through the gate insulating film 112, the second oxide semiconductor film 116 is not directly exposed to plasma, so that the second oxide semiconductor film 116 is less damaged and can be prevented from being reduced in thickness.

Figure 1H:
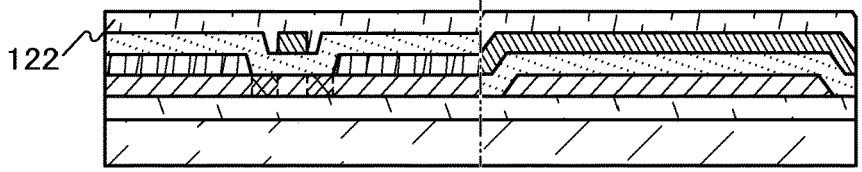

Next, the interlayer insulating film 122 is formed (see FIG. 1H).

The interlayer insulating film 122 may be formed of a material similar to that of the base insulating film 102.

Next, fifth heat treatment may be performed. The fifth heat treatment is performed at a temperature of higher than or equal to 150° C. and lower than or equal to 450° C., preferably higher than or equal to 250° C. and lower than or equal to 325° C. Alternatively, the temperature may be increased stepwise from 250° C. to 325° C. Furthermore, oxygen may be supplied from the interlayer insulating film 122 to the oxide semiconductor film 126 in the fifth heat treatment.

Through the above steps, a transistor with an extremely small off-state current can be manufactured.

In addition, with the use of the transistor including an oxide semiconductor film described in this embodiment, it is possible to provide a semiconductor device having high reliability even when a large-sized substrate such as a mother glass is used and thus capable of mass production.

Embodiment 2

Figure 3A:
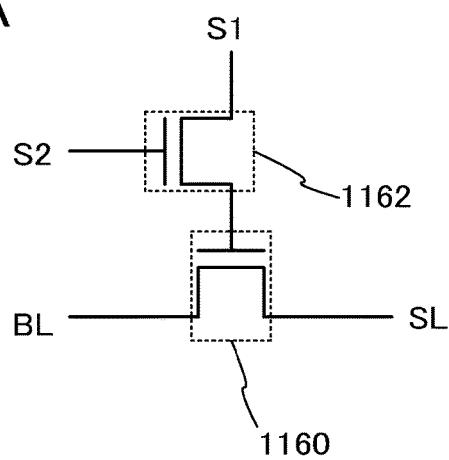
FIGS. 3A and 3B are examples of a circuit diagram showing an embodiment of the present invention.

An example of a circuit diagram of a memory element (hereinafter also referred to as a memory cell) included in a semiconductor device is illustrated in FIG. 3A. The memory cell includes a transistor 1160 in which a channel formation region is formed using a material other than an oxide semiconductor (such as silicon, germanium, silicon carbide, gallium arsenide, gallium nitride, or an organic compound) and a transistor 1162 in which a channel formation region is formed using an oxide semiconductor.

The transistor 1162 in which the channel formation region is formed using an oxide semiconductor can be manufactured in accordance with Embodiment 1.

As illustrated in FIG. 3A, a gate electrode of the transistor 1160 is electrically connected to one of a source electrode and a drain electrode of the transistor 1162. A first wiring SL (a 1st line, also referred to as a source line) is electrically connected to a source electrode of the transistor 1160. A second wiring BL (a 2nd line, also referred to as a bit line) is electrically connected to a drain electrode of the transistor 1160. A third wiring S1 (a 3rd line, also referred to as a first signal line) is electrically connected to the other of the source electrode and the drain electrode of the transistor 1162. A fourth wiring S2 (a 4th line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data are described. First, a potential of the fourth wiring S2 is set to a potential at which the transistor 1162 is turned on, so that the transistor 1162 is turned on. Thus, a potential of the third wiring S1 is supplied to the gate electrode of the transistor 1160 (writing). After that, the potential of the fourth wiring S2 is set to a potential at which the transistor 1162 is turned off, so that the transistor 1162 is turned off, and thus, the potential of the gate electrode of the transistor 1160 is held (holding).

Since the off-state current of the transistor 1162 is smaller than the off-state current of the transistor 1160, the potential of the gate electrode of the transistor 1160 is held for a long time. For example, when the potential of the gate electrode of the transistor 1160 is a potential at which the transistor 1160 is in an on state, the on state of the transistor 1160 is held for a long time. Alternatively, when the potential of the gate electrode of the transistor 1160 is a potential at which the transistor 1160 is an off state, the off state of the transistor 1160 is held for a long time.

Then, reading of data is described. When a predetermined potential (a constant potential) is supplied to the first wiring SL in a state where the on state or the off state of the transistor 1160 is held as described above, a potential of the second wiring BL varies depending on the on state or the off state of the transistor 1160. For example, when the transistor 1160 is in the on state, the potential of the second wiring BL is close to the potential of the first wiring SL. On the other hand, when the transistor 1160 is in the off state, the potential of the second wiring BL does not vary.

In such a manner, the potential of the second wiring BL and a predetermined potential are compared with each other in a state where data is held, whereby the data can be read out.

Then, rewriting of data is described. Rewriting of data is performed in a manner similar to that of the writing and holding of data. That is, a potential of the fourth wiring S2 is set to a potential at which the transistor 1162 is turned on, so that the transistor 1162 is turned on. Thus, a potential of the third wiring S1 (a potential for new data) is supplied to the gate electrode of the transistor 1160. After that, the potential of the fourth wiring S2 is set to be a potential at which the transistor 1162 is turned off, so that the transistor 1162 is turned off, and thus, the new data is held.

In the memory cell according to the disclosed invention, data can be directly rewritten by writing of another data as described above. For that reason, erasing operation which is necessary for a flash memory or the like is not needed, so that operation speed can be reduced because erasing operation can be suppressed. In other words, high-speed operation of the semiconductor device including the memory cell can be realized.

Figure 3B:
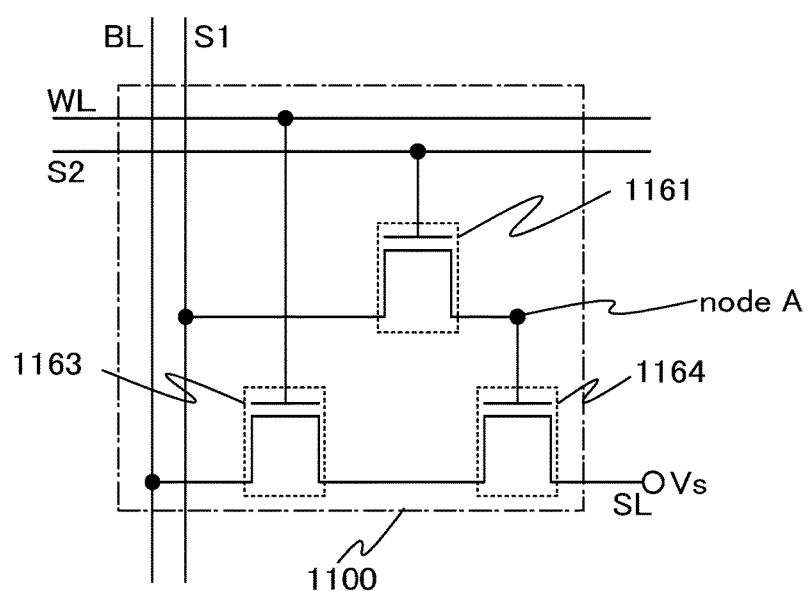

FIG. 3B is a circuit diagram illustrating an application example of the memory cell illustrated in FIG. 3A.

A memory cell 1100 illustrated in FIG. 3B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, a specific example of operation of the circuit will be described. Note that the values of a potential, a voltage, and the like in the description below can be changed as appropriate.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that at the end of the writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of the data "1" and set to approximately 0 V after the writing of the data "0". Electric charge corresponding to a potential of the third wiring S1 is accumulated at the node A; since the off-state current of the transistor 1161 is extremely small as mentioned above, the potential of the gate electrode of the transistor 1164 is held for a long time.

When data is read from the memory cell, the first wiring SL is set to 0 V, the fifth wiring WL is set to 2 V, the fourth wiring S2 and the third wiring S1 are set to 0 V, and a reading circuit connected to the second wiring BL is set in an operation state. At this time, the transistor 1163 is in an on state and the transistor 1161 is in an off state.

The transistor 1164 is in an off state when the data "0" has been written, that is, the node A is set to approximately 0 V, so that the resistance between the second wiring BL and the first wiring SL is high. On the other hand, the transistor 1164 is in an on state when the data "1" has been written, that is, the node A is set to approximately 2 V, so that the resistance between the second wiring BL and the first wiring SL is low. The reading circuit can read the data "0" or the data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that the data "1" and the data "0" are defined for convenience and can be reversed. In addition, the above operation voltages are examples. The operation voltages are set so that the transistor 1164 is turned off in the case where data "0" has been written and turned on in the case where data "1" has been written, the transistor 1161 is turned on at the time of writing and turned off in periods except the time of writing, and the transistor 1163 is turned on at the time of reading. In particular, a power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 3A or 3B and can be changed as appropriate.

Figure 4:
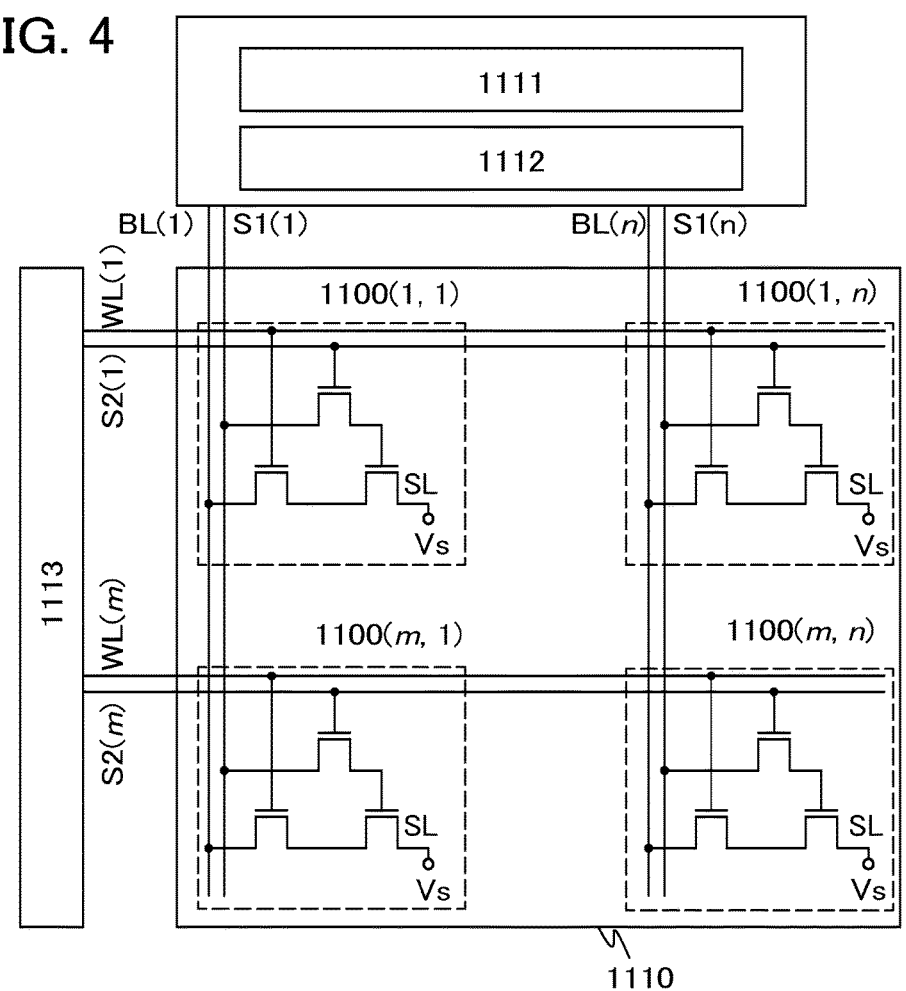
FIG. 4 is an example of a circuit diagram showing an embodiment of the present invention.

FIG. 4 is a block circuit diagram of a semiconductor device according to an embodiment of the present invention. The semiconductor device includes m×n bits of memory capacity.

The semiconductor device illustrated in FIG. 4 includes m fifth wirings WL(1) to WL(m), m fourth wirings S2(1) to S2($m$), n second wirings BL(1) to BL(n), n third wirings S1(1) to S1($n$), a memory cell array 1110 in which a plurality of memory cells 1100(1,1) to 1100($m,n$) are arranged in a matrix of m rows by n columns (m and n are each a natural number), and peripheral circuits such as a driver circuit 1111 for driving the second wirings BL and the third wirings S1, a driver circuit 1113 for driving the fourth wirings S2 and the fifth wirings WL, and a reading circuit 1112. A refresh circuit or the like may be provided as another peripheral circuit.

A memory cell 1100($i,j$) is considered as a typical example of the memory cell. Here, the memory cell 1100($i,j$) (i is an integer of greater than or equal to 1 and less than or equal to m and j is an integer of greater than or equal to 1 and less than or equal to n) is connected to a second wiring BL(j), a third wiring S1(j), a fourth wiring S2($i$), a fifth wiring WL(i), and a first wiring SL. A first wiring potential Vs is supplied to the first wiring SL. The second wirings BL(1) to BL(n) and the third wirings S1(1) to S1($n$) are connected to the driver circuit 1111 and the reading circuit 1112. The fifth wirings WL(1) to WL(m) and the fourth wirings S2(1) to S2($m$) are connected to the driver circuit 1113.

The operation of the semiconductor device illustrated in FIG. 4 is described. In this structure, data is written and read per row.

When data is written into memory cells 1100($i$,1) to 1100($i,n$) of an i-th row, the potential Vs of the first wiring SL is set to 0 V, a fifth wiring WL(i) and the second wirings BL(1) to BL(n) are set to 0 V, and a fourth wiring S2($i$) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2($i$) is set to 0 V before the potentials of the third wirings S1(1) to S1($n$) are changed, so that the transistors 1161 are turned off. Moreover, the fifth wirings WL other than the fifth wiring WL(i) are set to 0 V, and the fourth wirings S2 other than the fourth wiring S2(i) are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V. The potential of the node A of the non-selected memory cell is not changed.

When data is read from the memory cells 1100(i,1) to 1100(i,n) of the i-th row, the potential Vs of the first wiring SL is set to 0 V, the fifth wiring WL(i) is set to 2 V, the fourth wiring S2(i) and the third wirings S1(1) to S1(n) are set to 0 V, and the reading circuit connected to the second wirings BL(1) to BL(n) is set in an operation state. The reading circuit can read data "0" or data "1" in accordance with the difference in resistance state of the memory cell, for example. Note that the fifth wirings WL other than the fifth wiring WL(i) and the fourth wirings S2 other than the fourth wiring S2(i) are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

In accordance with this embodiment, a potential of a node connected to a transistor in which a channel formation region is formed using an oxide semiconductor can be held for a very long time, whereby a memory element capable writing, holding, and reading of data with low power consumption can be manufactured.

The structures, methods, and the like described in this embodiment can be combined as appropriate with any of the structures, methods, and the like described in the other embodiments.

Embodiment 3

In this embodiment, an example of a circuit diagram of a memory cell including a capacitor is described. A memory cell 1170 illustrated in FIG. 5A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

The transistor 1172 in which a channel formation region is formed using an oxide semiconductor can be manufactured in accordance with Embodiment 1.

Here, a gate electrode of the transistor 1171, one of a source electrode and a drain electrode of the transistor 1172, and one electrode of the capacitor 1173 are electrically connected to each other. In addition, the first wiring SL is electrically connected to a source electrode of the transistor 1171. The second wiring BL is electrically connected to a drain electrode of the transistor 1171. The third wiring S1 is electrically connected to the other of the source electrode and the drain electrode of the transistor 1172. The fourth wiring S2 is electrically connected to a gate electrode of the transistor 1172. The fifth wiring WL is electrically connected to the other electrode of the capacitor 1173.

Next, a specific example of operation of the circuit will be described. Note that the values of a potential, a voltage, and the like in the description below can be changed as appropriate.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and is set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V is described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of reading is set to 0 V; however, the third wiring S1 may be in a floating state or may be charged to have a potential higher than 0 V. Data "1" and data "0" are defined for convenience and may be reversed.

The potential of the third wiring S1 at the time of writing may be selected from the potentials of data "0" and data "1" as long as the transistor 1172 is turned off after the writing and the transistor 1171 is turned off in the case where the potential of the fifth wiring WL is set to 0 V. The potential of the fifth wiring WL at the time of reading may be selected so that the transistor 1171 is turned off in the case where data "0" has been written and is turned on in the case where data "1" has been written. For example, the threshold voltage of the transistor 1171 may be employed. The transistor 1171 can have any threshold voltage as long as the transistor 1171 operates in the above-described manner.

An example of a NOR-type semiconductor memory device in which a memory cell including a capacitor and a selection transistor having a first gate electrode and a second gate electrode is used will be described with reference to FIG. 5B.

Figure 5B:
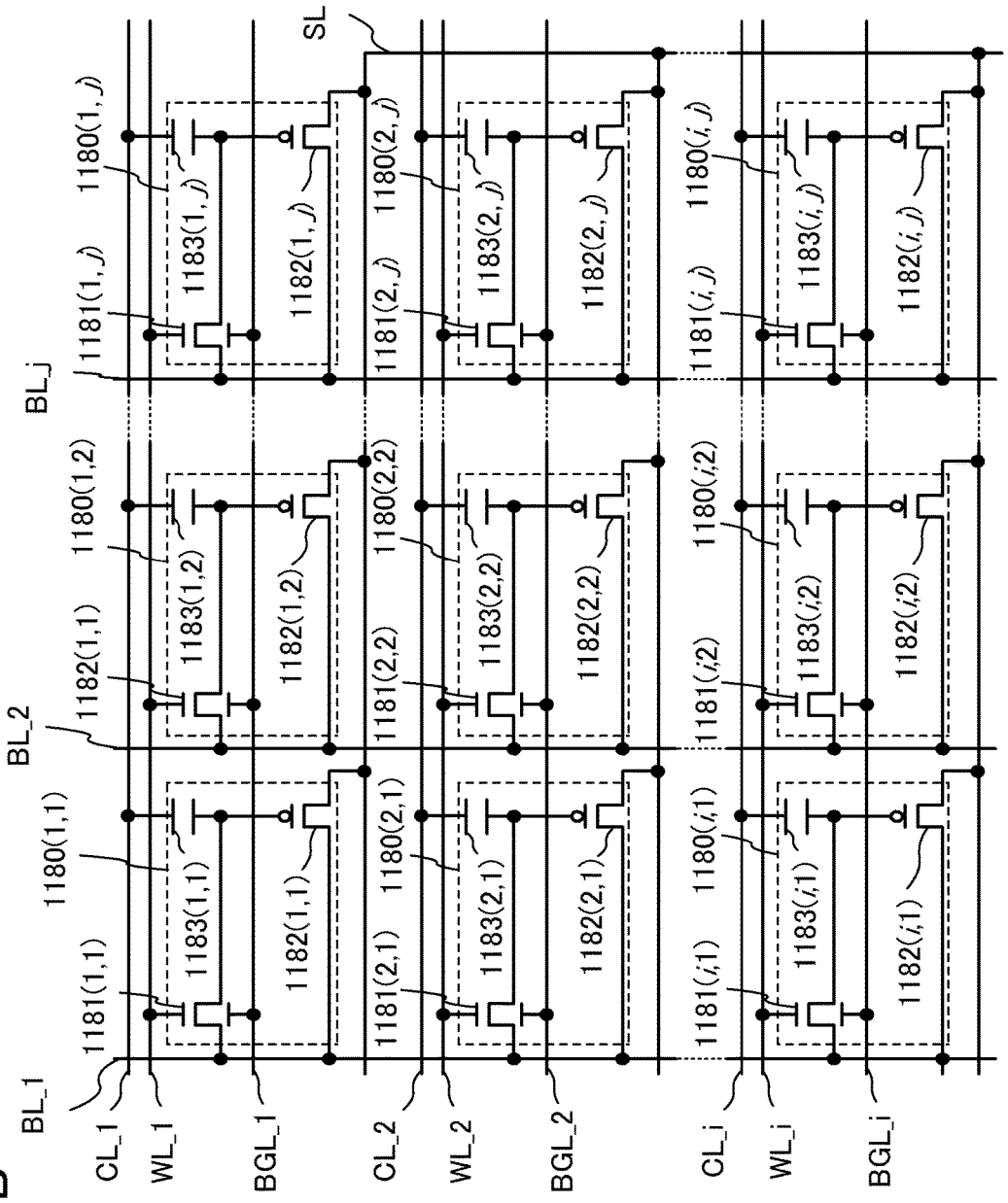

A memory cell array illustrated in FIG. 5B includes a plurality of memory cells 1180 arranged in a matrix of i rows (i is a natural number of greater than or equal to 3) by j columns (j is a natural number of greater than or equal to 3), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL. Note that explanation is given for the memory cell array having i gate lines BGL (gate lines BGL_1 to BGL_i) in this embodiment. However, the structure of the memory cell array is not limited thereto, and the memory cell array does not necessarily have the gate lines BGL. Here, i and j are each a natural number of greater than or equal to 3 for convenience, but the number of rows and the number of columns of the memory cell array described in this embodiment are not necessarily greater than or equal to 3. A memory cell array including one row or one column may be used or a memory cell array including two rows or two columns may be used.

Further, each of the plurality of memory cells 1180 (also referred to as a memory cell 1180(M,N) (note that M is a natural number of greater than or equal to 1 and less than or equal to i and N is a natural number of greater than or equal to 1 and less than or equal to j)) includes a transistor 1181(M,N), a capacitor 1183(M,N), and a transistor 1182(M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with a voltage applied between the first capacitor electrode and the second capacitor electrode.

The transistor 1181(M,N) is an n-channel transistor which has a source electrode, a drain electrode, a first gate electrode, and a second gate electrode. Note that in the semiconductor memory device in this embodiment, the transistor 1181 is not necessarily an n-channel transistor.

One of the source electrode and the drain electrode of the transistor 1181(M,N) is connected to the bit line BL_N. The first gate electrode of the transistor 1181(M,N) is connected to the word line WL_M. The second gate electrode of the transistor 1181(M,N) is connected to the gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 is necessarily a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to the capacitor line CL_M. A second capacitor electrode of the capacitor 1183(M,N) is connected to the other of the source electrode and the drain electrode of the transistor 1181(M,N). Note that the capacitor 1183(M,N) serves as a storage capacitor.

The voltage of the word lines WL_1 to WL_i is controlled by, for example, a driver circuit including a decoder.

The voltage of the bit lines BL_1 to BL_j is controlled by, for example, a driver circuit including a decoder.

The voltage of the capacitor lines CL_1 to CL_i is controlled by, for example, a driver circuit including a decoder.

The voltage of the gate lines BGL_1 to BGL_i is controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, a current flowing between the source electrode and the drain electrode of the transistor 1181 in an off state can be extremely small. Thus, a data holding period in the memory circuit can be longer. In addition, a voltage necessary for writing and reading data can be made lower than that of a conventional semiconductor device; thus, power consumption can be reduced.

In accordance with this embodiment, a potential of a node connected to a transistor in which a channel formation region is formed using an oxide semiconductor can be held for a very long time, whereby a memory element capable of writing, holding, and reading of data with low power consumption can be manufactured.

The structures, methods, and the like described in this embodiment can be combined with any of the structures, methods, and the like described in the other embodiments as appropriate.

Embodiment 4

In this embodiment, examples of a semiconductor device using the transistor described in Embodiment 1 will be described with reference to FIGS. 6A and 6B.

Figure 6A:
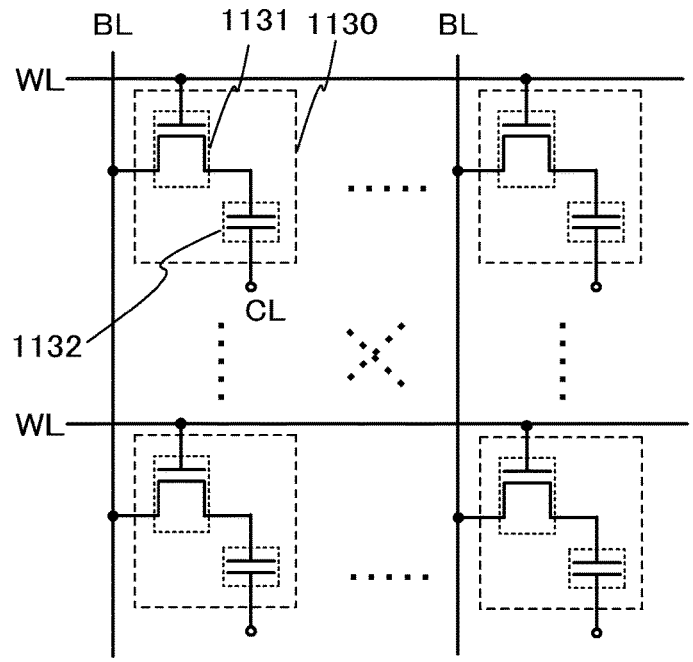
FIGS. 6A and 6B are examples of a circuit diagram showing an embodiment of the present invention.

FIG. 6A illustrates an example of a semiconductor device whose structure corresponds to that of a so-called dynamic random access memory (DRAM). A memory cell array 1120 illustrated in FIG. 6A has a structure in which a plurality of memory cells 1130 are arranged in a matrix. Further, the memory cell array 1120 includes m first wirings BL and n second wirings WL. Note that in this embodiment, the first wiring BL and the second wiring WL are referred to as a bit line BL and a word line WL, respectively.

The memory cell 1130 includes a transistor 1131 and a capacitor 1132. A gate electrode of the transistor 1131 is connected to the second wiring WL. Further, one of a source electrode and a drain electrode of the transistor 1131 is connected to the first wiring BL. The other of the source electrode and the drain electrode of the transistor 1131 is connected to one electrode of the capacitor. The other electrode of the capacitor is connected to a capacitor line CL and is supplied with a predetermined potential. The transistor described in Embodiment 1 is applied to the transistor 1131.

The transistor in which a channel formation region is formed using an oxide semiconductor which is described in Embodiment 1 is characterized by having a smaller off-state current than a transistor in which a channel formation region is formed using single crystal silicon. Accordingly, when the transistor described in Embodiment 1 is applied to the semiconductor device illustrated in FIG. 6A which is regarded as a so-called DRAM, a substantially nonvolatile memory can be obtained.

Figure 6B:
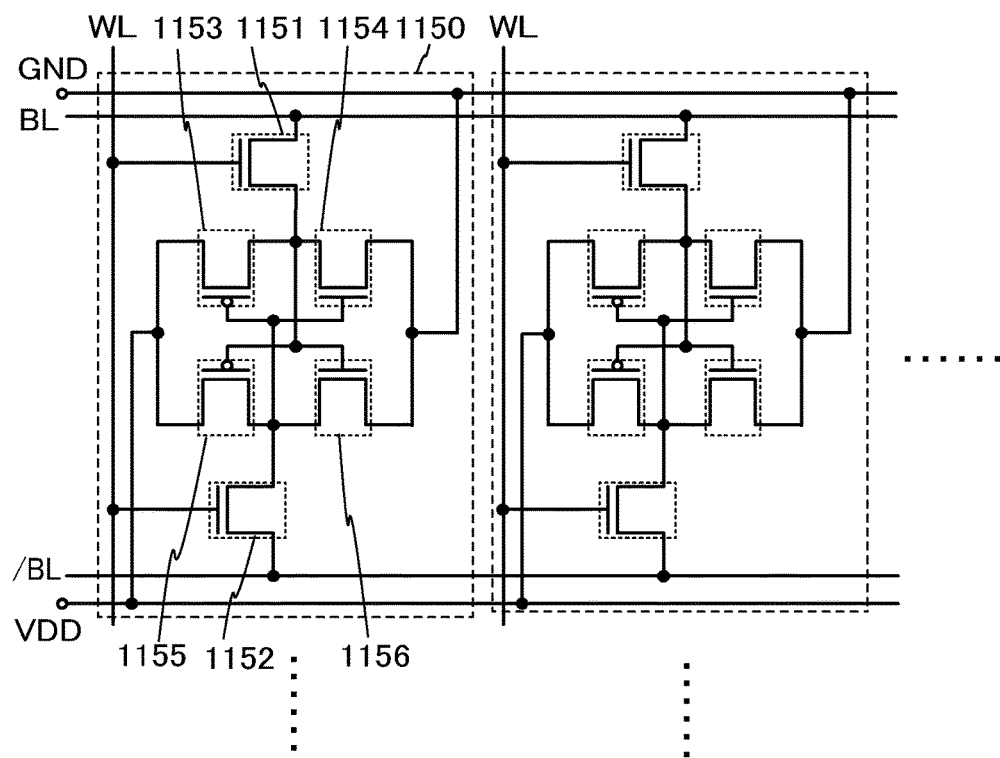

FIG. 6B illustrates an example of a semiconductor device whose structure corresponds to that of a so-called static random access memory (SRAM). A memory cell array 1140 illustrated in FIG. 6B can have a structure in which a plurality of memory cells 1150 are arranged in a matrix. Further, the memory cell array 1140 includes a plurality of first wirings BL, a plurality of second wirings WL, and a plurality of third wirings (inverted bit lines/BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in Embodiment 1 can be applied to these transistors. Each of the third transistor 1153 and the fifth transistor 1155 is a p-channel transistor in which a channel formation region is formed using a material other than an oxide semiconductor. However, in the first to sixth transistors 1151 to 1156, the transistor described in Embodiment 1 may be applied to the p-channel transistors, or a transistor in which a channel formation region is formed using a material other than an oxide semiconductor may be applied to the n-channel transistors.

The structures, methods, and the like described in this embodiment can be combined as appropriate with any of the structures, methods, and the like described in the other embodiments.

Embodiment 5

A central processing unit (CPU) can be formed using a transistor in which a channel formation region is formed using an oxide semiconductor for at least part of the CPU.

Figure 7A:
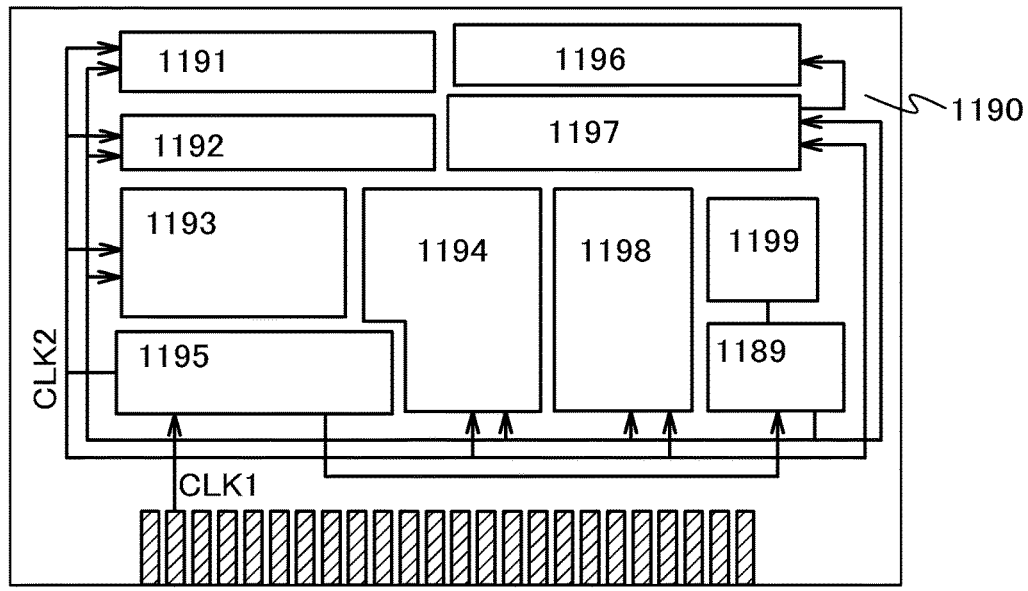
FIGS. 7A to 7C are a block diagram illustrating a specific structure of a CPU and circuit diagrams illustrating part of the CPU.

FIG. 7A is a block diagram illustrating a specific structure of a CPU. The CPU illustrated in FIG. 7A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU illustrated in FIG. 7A is only an example in which the structure is simplified, and an actual CPU has various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 7A, a memory element is provided in the register 1196. The memory element described in Embodiment 2 can be used as the memory element provided in the register 1196.

In the CPU illustrated in FIG. 7A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, a power supply voltage is supplied to the memory element in the register 1196. When data holding by the capacitor is selected, the data is rewritten in the capacitor, and supply of a power supply voltage to the memory element in the register 1196 can be stopped.

Figure 7B:
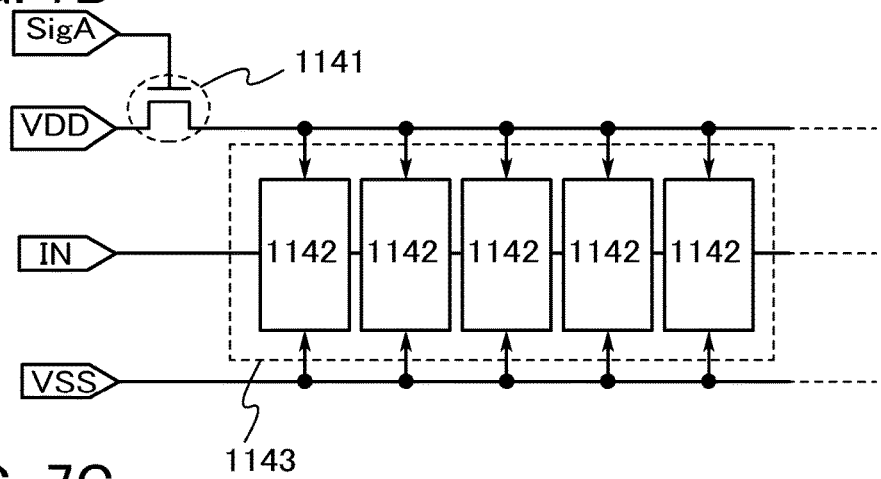
Figure 7C:
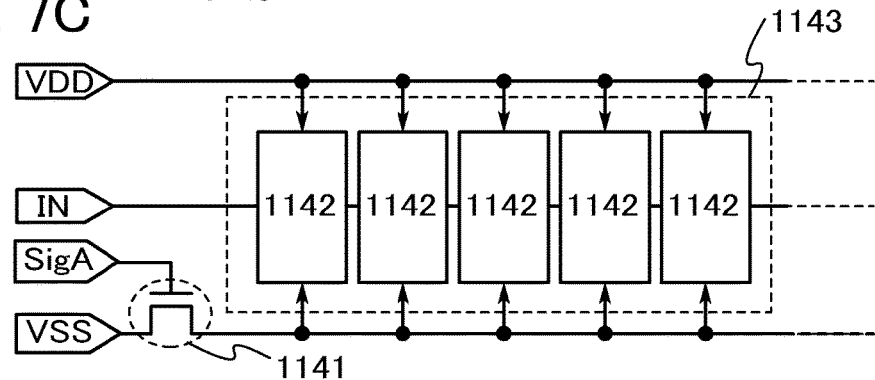

The power supply can be stopped by providing a switching element between a memory element group and a node to which a power supply potential VDD or a power supply potential VSS is supplied, as illustrated in FIG. 7B or FIG. 7C. Circuits illustrated in FIGS. 7B and 7C are described below.

FIGS. 7B and 7C each illustrate an example of a structure of a memory circuit including a transistor in which a channel formation region is formed using an oxide semiconductor as a switching element for controlling supply of a power supply potential to a memory element.

The memory device illustrated in FIG. 7B includes a switching element 1141 and a memory element group 1143 including a plurality of memory elements 1142. Specifically, as each of the memory elements 1142, the memory element described in Embodiment 2 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 7B, a transistor in which a channel formation region is formed using an oxide semiconductor is used for the switching element 1141, and the switching of the transistor is controlled by a signal SigA supplied to a gate electrode thereof.

Note that FIG. 7B illustrates the structure in which the switching element 1141 includes only one transistor; however, without limitation thereto, the switching element 1141 may include a plurality of transistors. In the case where the switching element 1141 includes a plurality of transistors which serve as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 7B, the switching element 1141 may control the supply of the low-level power supply potential VSS.

In FIG. 7C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor according to Embodiment 1 can also be applied to an LSI such as a digital signal processor (DSP), a custom LSI, or a field programmable gate array (FPGA).

This embodiment can be implemented by being combined with any of the above-described embodiments as appropriate.

Embodiment 6

In this embodiment, described is an example of a display device formed using a transistor having an oxide semiconductor in a channel formation region. As a display element provided in the display device, a liquid crystal element (also referred to as a liquid crystal display element), a light-emitting element (also referred to as a light-emitting display element) or the like can be used. The light-emitting element includes, in its category, an element whose luminance is controlled by a current or a voltage, and specifically an inorganic electroluminescent (EL) element, an organic EL element, and the like. Furthermore, a display medium whose contrast is changed by an electric effect, such as electronic ink, can be used as the display element. In this embodiment, a liquid crystal display device is explained as an example of a display device with reference to FIGS. 8A and 8B.

Note that the display device of the present embodiment includes in its category a panel in which a display element is sealed, and a module in which an IC such as a controller or the like is mounted on the panel.

Additionally, the display device in this embodiment refers to an image display device, a display device, or a light source (including a lighting device). The display device includes any of the following modules in its category: a module provided with a connector such as an FPC, a TAB tape, or TCP; a module in which a printed wiring board is provided at the end of a TAB tape or TCP; and a module in which an integrated circuit (IC) is mounted directly on a display element by a COG method.

In FIG. 8A, a sealant 205 is provided so as to surround a pixel portion 202 and a scan line driver circuit 204 which are provided over a first substrate 201. A second substrate 206 is provided over the pixel portion 202 and the scan line driver circuit 204. Thus, the pixel portion 202 and the scan line driver circuit 204 are sealed together with a display element such as a liquid crystal element, by the first substrate 201, the sealant 205, and the second substrate 206. In FIG. 8A, a signal line driver circuit 203 that is separately prepared using a single crystal semiconductor film or a polycrystalline semiconductor film over a substrate is mounted in a region that is different from the region surrounded by the sealant 205 over the first substrate 201. In FIG. 8A, various signals and potentials are supplied to the signal line driver circuit 203, the scan line driver circuit 204, and the pixel portion 202 from a flexible printed circuit (FPC) 218.

Although FIG. 8A illustrates the example in which the scan line driver circuit 204 is provided over the first substrate 201 and the signal line driver circuit 203 is formed separately and mounted on the first substrate 201, an embodiment of the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like may be used. FIG. 8A illustrates an example in which the signal line driver circuit 203 is mounted by a COG method.

The pixel portion and the scan line driver circuit which are provided over the first substrate each include a plurality of transistors, and the transistor described in Embodiment 1 can be applied to the plurality of transistors.

FIG. 8B is a cross-sectional view taken along line M-N in FIG. 8A.

Each of the pixel portion 202 and the scan line driver circuit 204 provided over the first substrate 201 includes a plurality of transistors. In FIG. 8B, a transistor 210 included in the pixel portion 202 and a transistor 211 included in the scan line driver circuit 204 are illustrated as an example.

In this embodiment, the transistor described in Embodiment 1 can be applied to the transistors 210 and 211. Accordingly, a semiconductor device having high reliability can be provided as the semiconductor device of this embodiment illustrated in FIG. 8B.

The transistor 210 provided in the pixel portion 202 is electrically connected to the display element to form a display panel.

A liquid crystal element 213 is a display element including a first electrode 230, a second electrode 231, and a liquid crystal layer 208. Note that an insulating film 232 and an insulating film 233 which serve as alignment films are provided so that the liquid crystal layer 208 is sandwiched therebetween. The second electrode 231 is formed on the second substrate 206 side. The first electrode 230 and the second electrode 231 are stacked with the liquid crystal layer 208 sandwiched therebetween.

A spacer 235 is a columnar spacer obtained by selective etching of an insulating film and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

The specific resistivity of the liquid crystal material is higher than or equal to $1 \times 10^9$ $\Omega \cdot cm$, preferably higher than or equal to $1 \times 10^{11}$ $\Omega \cdot cm$, more preferably higher than or equal to $1 \times 10^{12}$ $\Omega \cdot cm$. The value of the specific resistivity in this specification is measured at 20° C.

The size of a storage capacitor provided in the liquid crystal display device is set considering the leakage current of the transistor provided in the pixel portion or the like so that electric charge can be held for a predetermined period. By using a transistor including an oxide semiconductor film, it is enough to provide a storage capacitor having a capacitance that is less than or equal to 1/3 or less than or equal to 1/5 of a liquid crystal capacitance of each pixel.

As illustrated in FIG. 8B, the semiconductor device includes a connection terminal electrode 215 and a terminal electrode 216. The connection terminal electrode 215 and the terminal electrode 216 are electrically connected to a terminal included in the FPC 218 through an anisotropic conductive film 219. Note that an oxide semiconductor film 217 is left below the terminal electrode 216.

The connection terminal electrode 215 is formed of the same conductive film as the first electrode 230. The terminal electrode 216 is formed of the same conductive film as a source electrode and a drain electrode of the transistor 210 and the transistor 211.

In the transistor used in this embodiment which includes an oxide semiconductor film, the off-state current can be made small. Therefore, an electric signal such as an image signal can be held for a long period, and a writing interval can be set long when the power is on. Accordingly, frequency of refresh operation can be reduced, which leads to an advantageous effect of suppressing power consumption.

In addition, the transistor including an oxide semiconductor film used in this embodiment can have relatively high field-effect mobility and thus can operate at high speed. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

As driving methods for liquid crystal in a liquid crystal display device, there are a vertical electric field method in which a voltage is applied vertically to a substrate, and a horizontal electric field method in which a voltage is applied parallel to a substrate. Operation modes of liquid crystal will be described below, using examples.

First, FIGS. 10A1 and 10A2 are cross-sectional schematic views each illustrating a pixel structure of a liquid crystal display device of a TN mode.

A layer 3100 having a display element is sandwiched between a first substrate 3101 and a second substrate 3102 which are arranged so as to face each other. A first polarizing plate 3103 is formed on the first substrate 3101 side and a second polarizing plate 3104 is formed on the second substrate 3102 side. The absorption axis of the first polarizing plate 3103 and the absorption axis of the second polarizing plate 3104 are in a cross nicol state.

Although not illustrated, a backlight and the like are provided outside the second polarizing plate 3104. A first electrode 3108 and a second electrode 3109 are provided on the first substrate 3101 and the second substrate 3102, respectively. The first electrode 3108 on the side opposite to the backlight, that is, on the viewing side, is formed so as to have a light-transmitting property.

In the case where a liquid crystal display device having such a structure is in a normally white mode, when a voltage is applied between the first electrode 3108 and the second electrode 3109 (referred to as a vertical electric field method), liquid crystal molecules 3105 are aligned vertically as illustrated in FIG. 10A1. Thus, light from the backlight cannot pass through the first polarizing plate 3103, which leads to black display.

When no voltage is applied between the first electrode 3108 and the second electrode 3109, the liquid crystal molecules 3105 are aligned horizontally and twisted on a plane surface as illustrated in FIG. 10A2. As a result, light from the backlight can pass through the first polarizing plate 3103, which leads to white display. The gray scale can be expressed by adjusting the voltage applied between the first electrode 3108 and the second electrode 3109. Thus, predetermined image display is performed.

When a color filter is provided, full color display can be performed. The color filter can be provided on either the first substrate 3101 side or on the second substrate 3102 side.

A known material may be used for a liquid crystal material used for a TN mode.

FIGS. 10B1 and 10B2 are cross-sectional schematic views each illustrating a pixel structure of a liquid crystal display device of a VA mode. In the VA mode, the liquid crystal molecules 3105 are aligned such that they are perpendicular to the substrate when there is no electric field.

In a manner similar to that in FIGS. 10A1 and 10A2, the first electrode 3108 and the second electrode 3109 are provided on the first substrate 3101 and the second substrate 3102, respectively. The first electrode 3108 on the side opposite to the backlight, that is, on the viewing side, is formed so as to have a light-transmitting property. The first polarizing plate 3103 is formed on the first substrate 3101 side and the second polarizing plate 3104 is formed on the second substrate 3102 side. The absorption axis of the first polarizing plate 3103 and the absorption axis of the second polarizing plate 3104 are in a cross nicol state.

When a voltage is applied between the first electrode 3108 and the second electrode 3109 (the vertical electric field method) in a liquid crystal display device having such a structure, the liquid crystal molecules 3105 are aligned horizontally as illustrated in FIG. 10B1. Thus, light from the backlight can pass through the first polarizing plate 3103, which leads to white display.

When no voltage is applied between the first electrode 3108 and the second electrode 3109, the liquid crystal molecules 3105 are aligned vertically as illustrated in FIG. 10B2. As a result, light from the backlight which is polarized by the second polarizing plate 3104 passes through a cell without being influenced by birefringence of the liquid crystal molecules 3105. Thus, the light from the backlight which is polarized cannot pass through the first polarizing plate 3103, which leads to black display. The gray scale can be expressed by adjusting the voltage applied between the first electrode 3108 and the second electrode 3109. Thus, predetermined image display is performed.

When a color filter is provided, full color display can be performed. The color filter can be provided on either the first substrate 3101 side or on the second substrate 3102 side.

FIGS. 10C1 and 10C2 are cross-sectional schematic views each illustrating a pixel structure of a liquid crystal display device of an MVA-mode. The MVA mode is a method in which one pixel is divided into a plurality of portions, and the portions have different alignment directions of the liquid crystal molecules 3105 and compensate the viewing angle dependencies. As illustrated in FIG. 10C1, in the MVA mode, a protrusion 3158 whose cross section is a triangle is provided on the first electrode 3108 and a protrusion 3159 whose cross section is a triangle is provided on the second electrode 3109 for controlling alignment.

Note that the structures other than the protrusions are in common with the structures in the VA mode.

When a voltage is applied between the first electrode 3108 and the second electrode 3109 (the vertical electric field method), the liquid crystal molecules 3105 are aligned so that a long axis of the liquid crystal molecule 3105 is substantially vertical to surfaces of the projections 3158 and 3159 as illustrated in FIG. 10C1. Thus, light from the backlight can pass through the first polarizing plate 3103, which leads to white display.

When no voltage is applied between the first electrode 3108 and the second electrode 3109, the liquid crystal molecules 3105 are aligned vertically as illustrated in FIG. 10C2. As a result, light from the backlight cannot pass through the first polarizing plate 3103, which leads to black display. The gray scale can be expressed by adjusting the voltage applied between the first electrode 3108 and the second electrode 3109. Thus, predetermined image display is performed.

When a color filter is provided, full color display can be performed. The color filter can be provided on either the first substrate 3101 side or on the second substrate 3102 side.

Figure 13A:
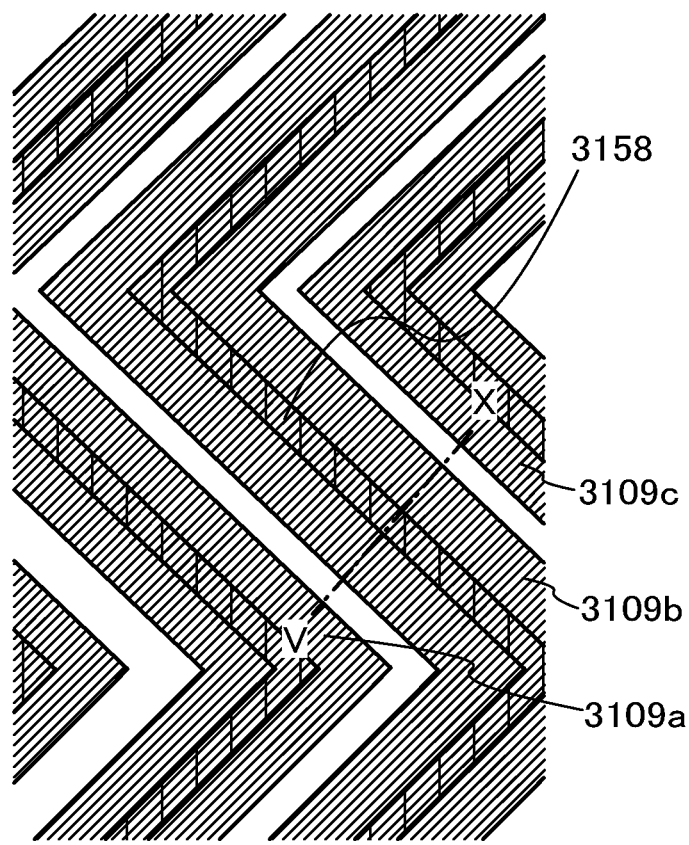
FIGS. 13A and 13B are a top view and a cross-sectional view illustrating an example of an operation mode of liquid crystal according to an embodiment of the present invention.
Figure 13B:
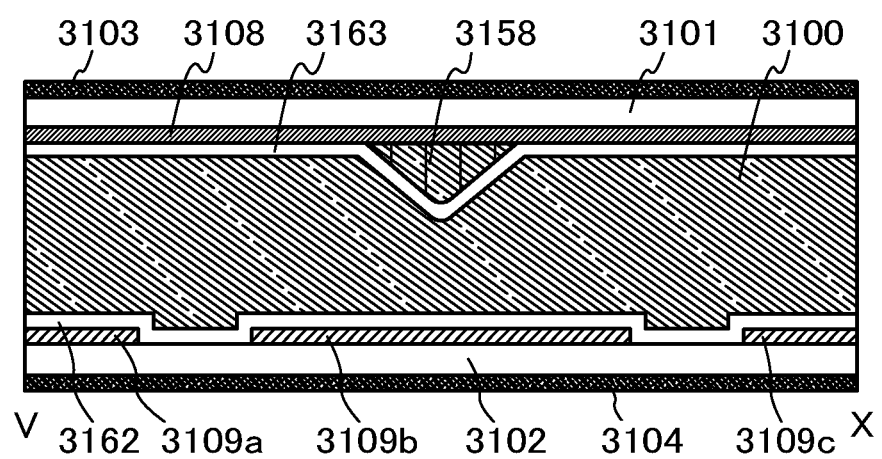

FIGS. 13A and 13B are a top view and a cross-sectional view, respectively, of another example of the MVA mode. As shown in FIG. 13A, a second electrode 3109a, a second electrode 3109b, and a second electrode 3109c are each formed into a bent pattern like a dogleg-like shape. As illustrated in FIG. 13B, an insulating film 3162 and an insulating film 3163 which function as an alignment film are formed over the second electrodes 3109a, 3109b, and 3109c and over the first electrode 3108, respectively. A protrusion 3158 is formed on a first electrode 3108 and over the second electrode 3109b.

FIGS. 11A1 and 11A2 are cross-sectional schematic views each illustrating a pixel structure of a liquid crystal display device of an OCB mode. In the OCB mode, the liquid crystal molecules 3105 is able to take a configuration which compensates the viewing angle dependence, and such a configuration is called a bend alignment.

As in FIGS. 10A1 to 10C2, the first electrode 3108 is provided on the first substrate 3101 and the second electrode 3109 is provided on the second substrate 3102. The first electrode 3108 on the side opposite to the backlight, that is, on the viewing side, is formed so as to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are in a cross nicol state.

When voltage is applied between the first electrode 3108 and the second electrode 3109 (the vertical electric field method) in a liquid crystal display device having such a structure, black display is performed. At that time, the liquid crystal molecules 3105 are aligned vertically as illustrated in FIG. 11A1. Thus, light from the backlight cannot pass through the first polarizing plate 3103, which leads to black display.

When no voltage is applied between the first electrode 3108 and the second electrode 3109, the liquid crystal molecules 3105 exist in a bend alignment state as illustrated in FIG. 11A2. As a result, light from the backlight can pass through the first polarizing plate 3103, which leads to white display. The gray scale can be expressed by adjusting the voltage applied between the first electrode 3108 and the second electrode 3109. Thus, predetermined image display is performed.

When a color filter is provided, full color display can be performed. The color filter can be provided on either the first substrate 3101 side or on the second substrate 3102 side.

In such an OCB mode, alignment of the liquid crystal molecules 3105 can compensate the viewing angle dependence. Further, with a pair of stacks of polarizer-including layers, the contrast ratio can be enhanced.

FIGS. 11B1 and 11B2 are cross-sectional schematic views each illustrating a pixel structure of a liquid crystal display device of an FLC mode or an AFLC mode.

As in FIGS. 10A1 to 10C2, the first electrode 3108 is provided on the first substrate 3101 and the second electrode 3109 is provided on the second substrate 3102. The first electrode 3108 on the side opposite to the backlight, that is, on the viewing side, is formed so as to have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are in a cross nicol state.

In the liquid crystal display device having such a structure, when a voltage is applied between the first electrode 3108 and the second electrode 3109 (referred to as a vertical electric field method), the liquid crystal molecules 3105 are aligned horizontally in a direction deviated from a rubbing direction. Thus, light from the backlight can pass through the first polarizing plate 3103, which leads to white display.

When no voltage is applied between the first electrode 3108 and the second electrode 3109, the liquid crystal molecules 3105 are aligned horizontally along the rubbing direction as illustrated in FIG. 11B2. As a result, light from the backlight cannot pass through the first polarizing plate 3103, which leads to black display. The gray scale can be expressed by adjusting the voltage applied between the first electrode 3108 and the second electrode 3109. Thus, predetermined image display is performed.

When a color filter is provided, full color display can be performed. The color filter can be provided on either the first substrate 3101 side or on the second substrate 3102 side.

A known material may be used for a liquid crystal material for an FLC mode or an AFLC mode.

FIGS. 12A1 and 12A2 are cross-sectional schematic views each illustrating a pixel structure of a liquid crystal display device of an IPS mode. The IPS mode is a mode in which the liquid crystal molecules 3105 are rotated in a plane parallel to a substrate by horizontal electric field generated by the electrodes provided for only one substrate side.

The IPS mode is characterized in that liquid crystal is controlled by a pair of electrodes provided for one substrate. Thus, a pair of electrodes 3150 and 3151 are provided over the second substrate 3102. The pair of electrodes 3150 and 3151 may each have a light-transmitting property. The first polarizing plate 3103 is formed on the first substrate 3101 side, and the second polarizing plate 3104 is formed on the second substrate 3102 side. The absorption axis of the first polarizing plate 3103 and the absorption axis of the second polarizing plate 3104 are in a cross nicol state.

When a voltage is applied between the pair of electrodes 3150 and 3151 in the liquid crystal display device having such a structure, the liquid crystal molecules 3105 are aligned along an electric flux line deviated from a rubbing direction as illustrated in FIG. 12A1. Thus, light from the backlight can pass through the first polarizing plate 3103, which leads to white display.

When no voltage is applied between the pair of electrodes 3150 and 3151, the liquid crystal molecules 3105 are aligned horizontally along the rubbing direction as illustrated in FIG. 12A2. As a result, light from the backlight cannot pass through the first polarizing plate 3103, which leads to black display. The gray scale can be expressed by adjusting the voltage applied between the pair of electrodes 3150 and 3151. Thus, predetermined image display is performed.

When a color filter is provided, full color display can be performed. The color filter can be provided on either the first substrate 3101 side or on the second substrate 3102 side.

Figure 14A:
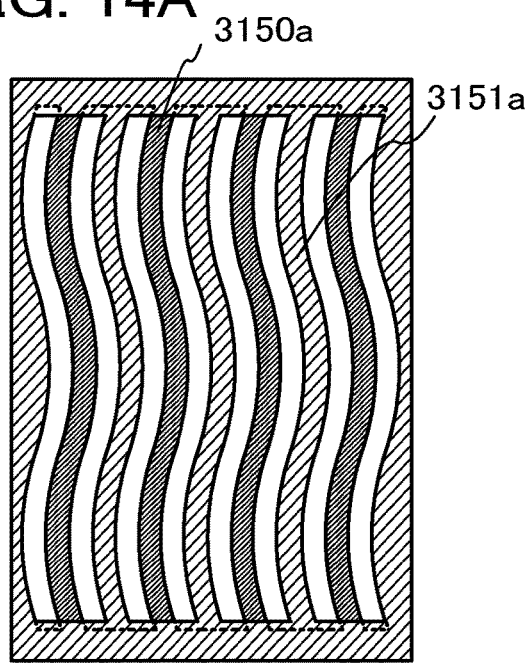
FIGS. 14A to 14C are top views each illustrating an example of an operation mode of liquid crystal according to an embodiment of the present invention.
Figure 14B:
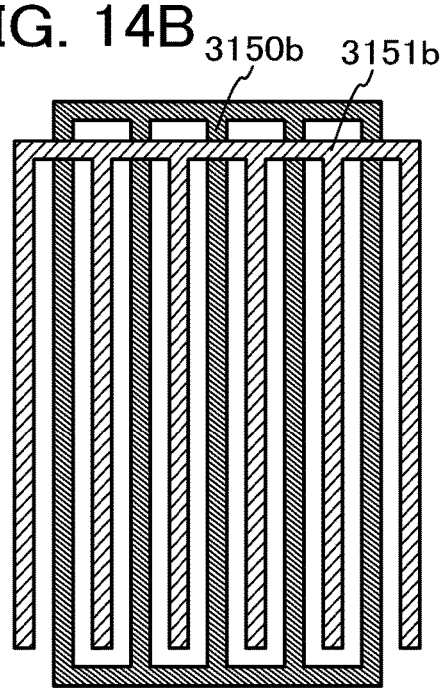
Figure 14C:
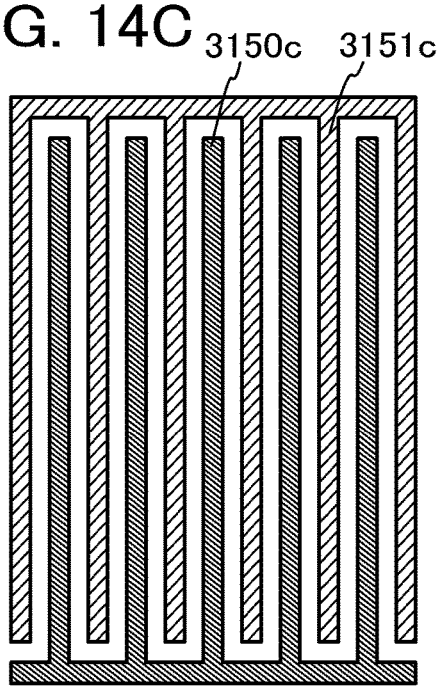

FIGS. 14A to 14C each illustrate an example of the pair of electrodes 3150 and 3151 that can be used in the IPS mode. As illustrated in top views of FIGS. 14A to 14C, the pair of electrodes 3150 and 3151 are alternatively formed. In FIG. 14A, electrodes 3150a and 3151a each have an undulating wave shape. In FIG. 14B, electrodes 3150b and 3151b each have a comb-like shape and partly overlap with each other. In FIG. 14C, electrodes 3150c and 3151c have a comb-like shape in which the electrodes are meshed with each other.

FIGS. 12B1 and 12B2 are cross-sectional schematic views each illustrating a pixel structure of a liquid crystal display device of an FFS mode. The FFS mode is also a horizontal electric field method as in the IPS mode and has a structure in which the electrode 3151 is formed over the electrode 3150 with an insulating film provided therebetween as illustrated in FIGS. 12B1 and 12B2.

The pair of electrodes 3150 and 3151 each preferably have a light-transmitting property. The first polarizing plate 3103 is formed on the first substrate 3101 side and the second polarizing plate 3104 is formed on the second substrate 3102 side. The absorption axis of the first polarizing plate 3103 and the absorption axis of the second polarizing plate 3104 are in a cross nicol state.

When a voltage is applied between the pair of electrodes 3150 and 3151 in a liquid crystal display device having such a structure, the liquid crystal molecules 3105 are aligned along an electric flux line deviated from a rubbing direction as illustrated in FIG. 12B1. Thus, light from the backlight can pass through the first polarizing plate 3103, which leads to white display.

When no voltage is applied between the pair of electrodes 3150 and 3151, the liquid crystal molecules 3105 are aligned horizontally along the rubbing direction as illustrated in FIG. 12B2. As a result, light from the backlight cannot pass through the first polarizing plate 3103, which leads to black display. The grayscale can be expressed by adjusting the voltage applied between the pair of electrodes 3150 and 3151. Thus, predetermined image display is performed.

When a color filter is provided e, full color display can be performed. The color filter can be provided on either the first substrate 3101 side or on the second substrate 3102 side.

Figure 15A:
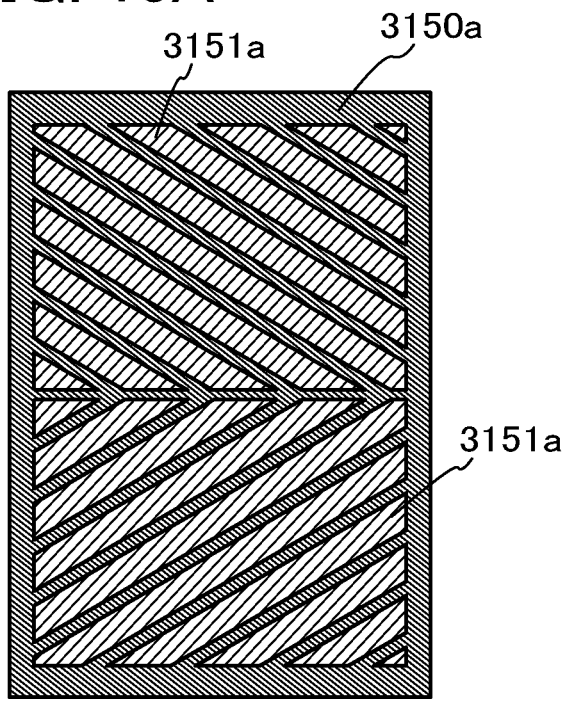
FIGS. 15A to 15C are top views each illustrating an example of an operation mode of liquid crystal according to an embodiment of the present invention.
Figure 15B:
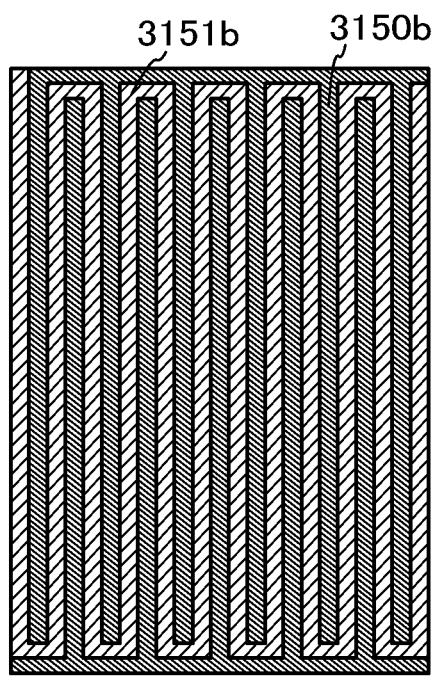
Figure 15C:
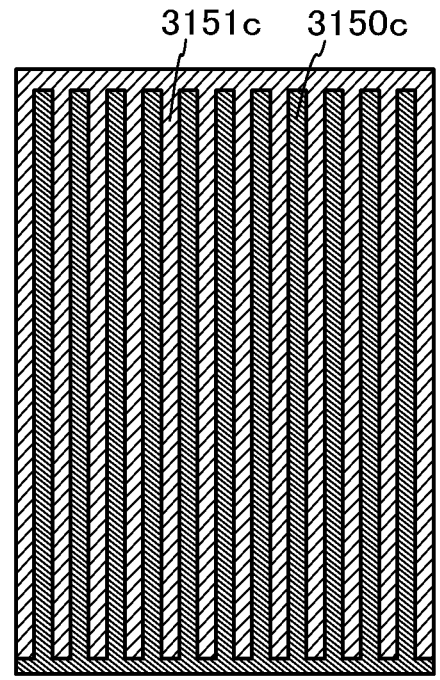

FIGS. 15A to 15C each show an example of the pair of electrodes 3150 and 3151 that can be used in the FFS mode. As illustrated in top views of FIGS. 15A to 15C, the electrode 3151 is formed with various patterns over the electrode 3150. In FIG. 15A, an electrode 3151a over an electrode 3150a has a bent dogleg-like shape. In FIG. 15B, an electrode 3151b over an electrode 3150b has a comb-like shape in which the electrodes are meshed with each other. In FIG. 15C, an electrode 3151c over an electrode 3150c has a comb-like shape.

A known material may be used as a liquid crystal material used for an IPS mode or an FFS mode. Liquid crystal exhibiting a blue phase may be used.

Another liquid crystal mode such as a PVA mode, an ASM mode, or a TBA mode may be employed.

In the display device, a black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method, or the like is employed. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

As mentioned above, as the display element included in the display device, a light-emitting element utilizing electroluminescence may be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of a voltage to a light-emitting element, electrons and holes are separately injected from a pair of electrodes into a layer containing a light-emitting organic compound, and a current flows. Then, the carriers (electrons and holes) are recombined, so that light is emitted. Owing to such a mechanism, this light-emitting element is referred to as a current-excitation light-emitting element.

Inorganic EL elements are classified according to their element structures into a dispersion-type inorganic EL element and a thin-film inorganic EL element. A dispersion-type inorganic EL element has a light-emitting layer in which particles of a light-emitting material are dispersed in a binder, and its light emission mechanism is donor-acceptor recombination type light emission that utilizes a donor level and an acceptor level. A thin-film inorganic EL element has a structure in which a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, at least one of a pair of electrodes may be transparent. Then, a transistor and a light-emitting element are formed over a substrate. The light-emitting element may have any of the following structures: a top emission structure in which light emission is extracted through the surface opposite to the substrate; a bottom emission structure in which light emission is extracted through the surface on the substrate side; or a dual emission structure in which light emission is extracted through the surface on the substrate side and the surface opposite to the substrate.

In FIG. 8B, a flexible substrate such as a plastic substrate having a light-transmitting property may be used as each of the first substrate 201 and the second substrate 206. The plastic can be a fiberglass-reinforced plastic (FRP) plate, a poly(vinyl fluoride) (PVF) film, a polyester film, or an acrylic resin film. Alternatively, a sheet in which aluminum foil is interposed between PVF films or polyester films can be used.

The display device shown in FIG. 8B performs display by transmitting light from a light source. Therefore, the substrate and the thin films such as the insulating film and the conductive film provided for the pixel portion where light is transmitted all have light-transmitting properties with respect to visible light.

The first electrode 230 and the second electrode 231 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive high molecule (also referred to as a conductive polymer) can be used for the first electrode 230 and the second electrode 231.

As the conductive high molecule, a so-called π-electron conjugated conductive polymer may be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

The first electrode 230 and the second electrode 231 may be formed using the same conductive film as the conductive film 108 as long as they have light-transmitting properties with respect to visible light. Alternatively, the first electrode 230 and the second electrode 231 may be formed using the same layer and the same material as a gate electrode of the transistor 210 as long as they have light-transmitting properties with respect to visible light.

Since the transistor is easily broken owing to static electricity or the like, a protection circuit for protecting the driver circuit is preferably provided. The protection circuit is preferably formed using a nonlinear element.

Figure 9A:
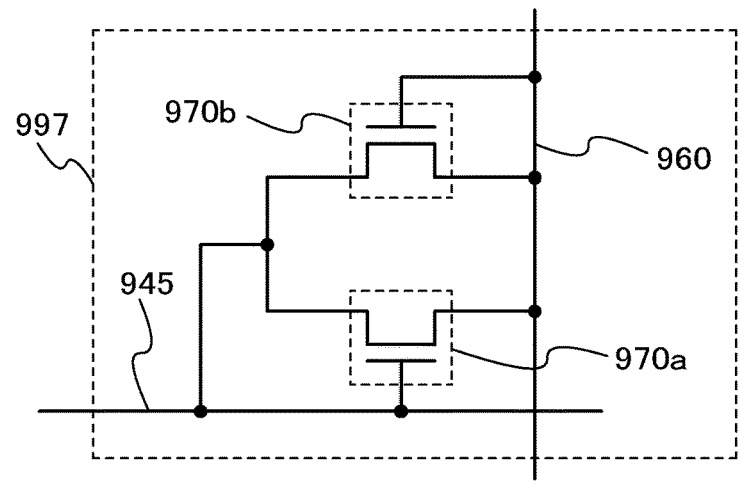
FIGS. 9A and 9B are a circuit diagram and a top view illustrating an example of a protection circuit according to an embodiment of the present invention.

An example of a circuit that can be applied to the protection circuit is illustrated in FIG. 9A. A protection circuit 997 includes transistors 970a and 970b which are n-channel transistors. In each of the transistors 970a and 970b, a gate terminal is connected to a drain terminal to provide characteristics similar to those of a diode. The transistor described in Embodiment 1 can be used as the transistors 970a and 970b.

A first terminal (a gate) and a third terminal (a drain) of the transistor 970a are connected to a first wiring 945, and a second terminal (a source) of the transistor 970a is connected to a second wiring 960. A first terminal (a gate) and a third terminal (a drain) of the transistor 970b are connected to the second wiring 960, and a second terminal (a source) of the transistor 970b is connected to the first wiring 945. That is, the protection circuit illustrated in FIG. 9A includes two transistors whose rectifying directions are opposite to each other, each of which is connected to the first wiring 945 and the second wiring 960. In other words, the protection circuit includes the transistor whose rectifying direction is from the first wiring 945 to the second wiring 960 and the transistor whose rectifying direction is from the second wiring 960 to the first wiring 945, between the first wiring 945 and the second wiring 960.

In the above protection circuit, when the second wiring 960 is positively or negatively charged due to static electricity or the like, a current flows in a direction in which the electric charge is cancelled. For example, when the second wiring 960 is positively charged, a current flows in a direction in which the positive electric charge is released to the first wiring 945. Owing to this operation, electrostatic breakdown or malfunctions of a circuit or an element connected to the charged second wiring 960 can be prevented. In the structure in which the charged second wiring 960 and another wiring intersect with each other with an insulating film interposed therebetween, this operation can further prevent dielectric breakdown of the insulating film.

Note that the protection circuit is not limited to the above structure. For example, a structure in which a plurality of transistors whose rectifying direction is from the first wiring 945 to the second wiring 960 and a plurality of transistors whose rectifying direction is from the second wiring 960 to the first wiring 945 are provided may be employed. In addition, a protection circuit can be configured using an odd number of transistors.

The protection circuit illustrated in FIG. 9A as an example can be applied to various uses. For example, the first wiring 945 is used as a common wiring of a display device, the second wiring 960 is used as one of a plurality of signal lines, and the protection circuit can be provided therebetween. A pixel transistor connected to the signal line which is provided with the protection circuit is protected from malfunctions, such as electrostatic breakdown due to a charged wiring, a shift in threshold voltage, and the like. The protection circuit can be applied to other parts of the display device as well as other devices such as a semiconductor memory device or a CPU.

Figure 9B:
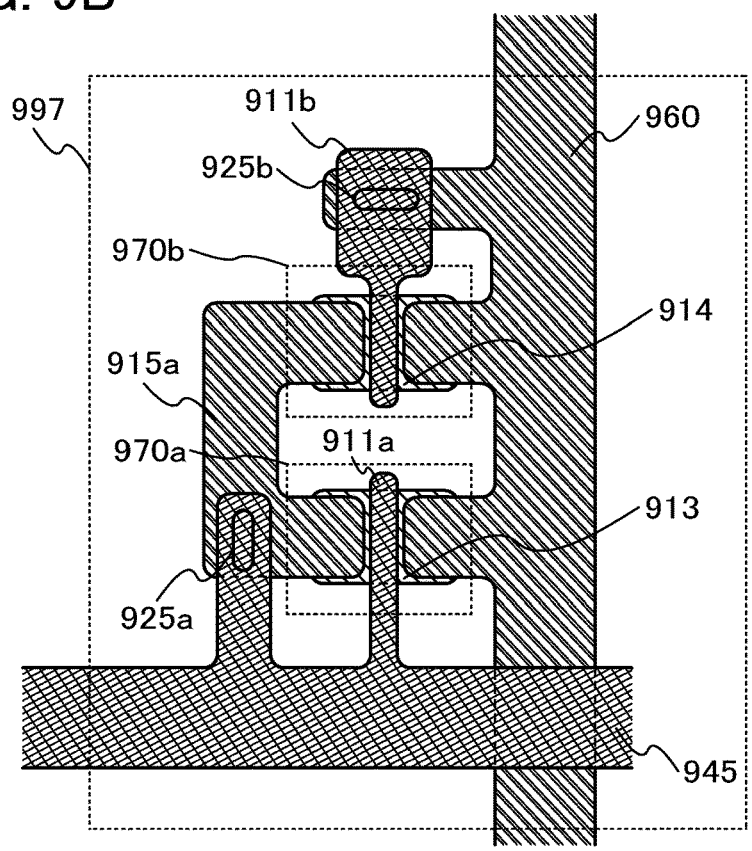

Next, an example in which the protection circuit 997 is formed over a substrate will be described. An example of a top view of the protection circuit 997 is illustrated in FIG. 9B.

The transistor 970a includes a gate electrode 911a, and the gate electrode 911a is connected to the first wiring 945. A source electrode of the transistor 970a is connected to the second wiring 960 and a drain electrode thereof is connected to the first wiring 945 through a first electrode 915a. In addition, the transistor 970a includes a semiconductor film 913 which overlaps with the gate electrode 911a between the source electrode and the drain electrode.

The transistor 970b includes a gate electrode 911b. The gate electrode 911b is connected to the second wiring 960 through a contact hole 925b. A drain electrode of the transistor 970b is connected to the second wiring 960. A source electrode of the transistor 970b is connected to the first wiring 945 through the first electrode 915a and a contact hole 925a. In addition, the transistor 970b includes a semiconductor film 914 which overlaps with the gate electrode 911b between the source electrode and the drain electrode.

As described above, by using the transistor which is exemplified in Embodiment 1, a highly reliable semiconductor device which consumes low power can be provided. Note that the transistor described in Embodiment 1 can be applied to not only the semiconductor device having a display function described above but also semiconductor devices having a variety of functions, such as a power device which is mounted on a power supply circuit, a semiconductor integrated circuit such as an LSI, and a semiconductor device having an image sensor function of reading data of an object.

In addition, release of electric charge through the transistor can be suppressed. Therefore, the frequency of rewriting display can be reduced in the case of an image with little motion (including a still image); thus, a further reduction in power consumption of a display device can be achieved.

As described above, according to an embodiment of the present invention, a liquid crystal display device with high display quality, high reliability, and low power consumption can be obtained.

This embodiment can be implemented in appropriate combination with any of other embodiments.

Embodiment 7

In this embodiment, examples of electric devices to which Embodiment 1 is applied will be described.

Figure 16A:
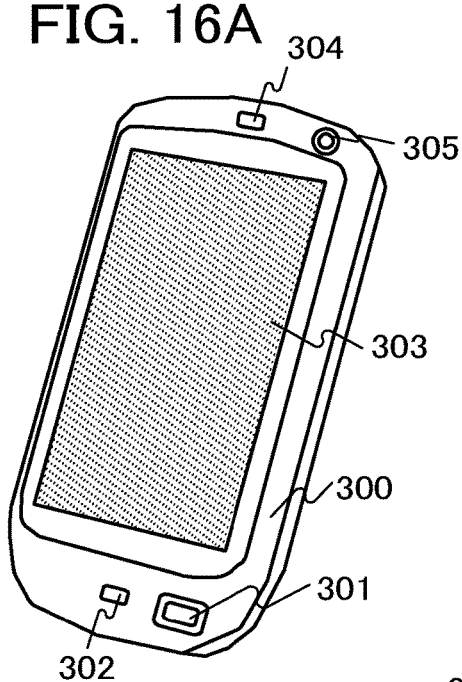
FIGS. 16A to 16C are perspective views each illustrating an example of an electronic device including a semiconductor device according to an embodiment of the present invention.

FIG. 16A illustrates a portable information terminal. The portable information terminal includes a housing 300, a button 301, a microphone 302, a display portion 303, a speaker 304, and a camera 305, and has a function as a mobile phone. An embodiment of the present invention can be applied to the display portion 303 and the camera 305. Although not illustrated, an embodiment of the present invention can also be applied to a CPU, a wireless circuit, or a memory circuit inside the main body.

Figure 16B:
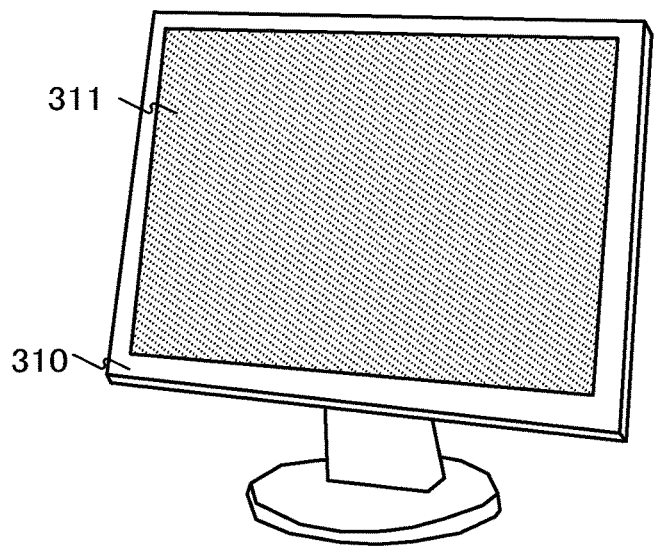

FIG. 16B illustrates a display. The display includes a housing 310 and a display portion 311. An embodiment of the present invention can be applied to the display portion 311. When an embodiment of the present invention is employed, a display having high display quality can be provided even in the case where the size of the display portion 311 is increased.

Figure 16C:
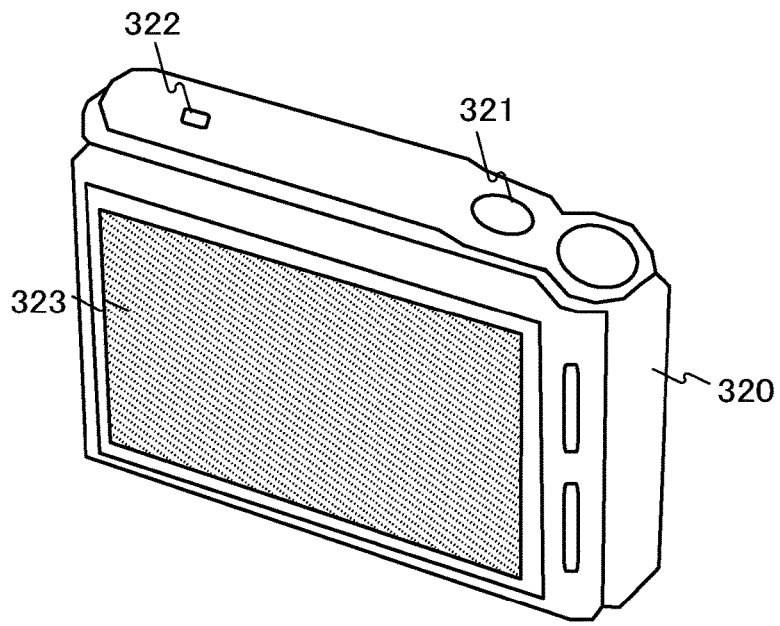

FIG. 16C illustrates a digital still camera. The digital still camera includes a housing 320, a button 321, a microphone 322, and a display portion 323. An embodiment of the present invention can be applied to the display portion 323. Although not illustrated, an embodiment of the present invention can also be applied to a memory circuit or an image sensor inside the main body.

When an embodiment of the present invention is employed, cost of an electronic device can be reduced. Further, a display device having high display quality can be obtained.

This embodiment can be implemented in appropriate combination with any of other embodiments.

This application is based on Japanese Patent Application serial no. 2011-004329 filed with Japan Patent Office on Jan. 12, 2011, the entire contents of which are hereby incorporated by reference.

What is claimed is:

1. A method for manufacturing a semiconductor device, the method comprising the steps of:
    forming an oxide semiconductor film over a substrate;
    forming a conductive film over the oxide semiconductor film;
    heating the conductive film formed over the oxide semiconductor film;
    forming a first resist mask over the conductive film;
    etching the conductive film using the first resist mask to form a source electrode and a drain electrode;
    forming a second resist mask over the oxide semiconductor film after etching the conductive film;
    etching the oxide semiconductor film using the second resist mask,
    forming a gate insulating film over the oxide semiconductor film; and
    forming a gate electrode over the gate insulating film.

2. The method according to claim 1,
    wherein the conductive film comprises W.

3. The method according to claim 1, further comprising the step of heating the substrate after forming the oxide semiconductor film and before forming the conductive film.

4. The method according to claim 1, further comprising the step of heating the substrate after forming the conductive film and before processing the conductive film.

5. A method for manufacturing a semiconductor device, the method comprising the steps of:
    forming a first oxide semiconductor film over a substrate;
    forming a second oxide semiconductor film over the first oxide semiconductor film;
    forming a conductive film over the second oxide semiconductor film;
    heating the conductive film formed over the second oxide semiconductor film;
    forming a first resist mask over the conductive film;
    etching the conductive film using the first resist mask to form a source electrode and a drain electrode;
    forming a second resist mask over the second oxide semiconductor film after etching the conductive film;
    etching the second oxide semiconductor film using the second resist mask;
    forming a gate insulating film over the second oxide semiconductor film; and
    forming a gate electrode over the gate insulating film.

6. The method according to claim 5,
    wherein the conductive film comprises W.

7. The method according to claim 5, further comprising the step of heating the substrate after forming the first oxide semiconductor film and before forming the conductive film.

8. The method according to claim 5, further comprising the step of heating the substrate after forming the conductive film and before processing the conductive film.

* * * * *